US011736003B2

(12) United States Patent
Sato et al.

(10) Patent No.: US 11,736,003 B2
(45) Date of Patent: Aug. 22, 2023

(54) CONTROL DEVICE OF POWER FACTOR CORRECTION CIRCUIT, POWER FACTOR CORRECTION CIRCUIT, POWER SUPPLY DEVICE, AND SEMICONDUCTOR DEVICE

(71) Applicant: ROHM Co., LTD., Kyoto (JP)

(72) Inventors: Yoshinori Sato, Kyoto (JP); Satoru Nate, Kyoto (JP); Yifei Tang, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 255 days.

(21) Appl. No.: 17/081,145

(22) Filed: Oct. 27, 2020

(65) Prior Publication Data

US 2021/0126525 A1 Apr. 29, 2021

(30) Foreign Application Priority Data

Oct. 28, 2019 (JP) .................................. 2019-195253

(51) Int. Cl.
*H02M 1/42* (2007.01)
*H01L 23/495* (2006.01)
*H01L 25/18* (2023.01)

(52) U.S. Cl.
CPC .... *H02M 1/4225* (2013.01); *H01L 23/49541* (2013.01); *H01L 25/18* (2013.01)

(58) Field of Classification Search
CPC .... H02M 1/42; H02M 1/4208; H02M 1/4216; H02M 1/4225; H02M 1/4258; H02M 1/4283; H02M 1/44; H02M 1/0003; H02M 1/0009; H02M 1/0016; H02M 1/0019; H02M 1/0022; H02M 1/0025;
(Continued)

(56) References Cited

U.S. PATENT DOCUMENTS

| 5,638,265 | A  | * | 6/1997 | Gabor       | H02M 1/4225 363/81    |
| 6,944,034 | B1 | * | 9/2005 | Shteynberg  | H02M 1/4258 363/21.13 |
| 9,337,744 | B1 | * | 5/2016 | Tsyrganovich | H02M 1/4208          |

FOREIGN PATENT DOCUMENTS

JP 2018-198500 12/2018

OTHER PUBLICATIONS

Japanese Office Action cited in JP application No. 2019-195253, dated Apr. 20, 2023.

* cited by examiner

*Primary Examiner* — Thienvu V Tran
*Assistant Examiner* — Carlos O Rivera-Perez
(74) *Attorney, Agent, or Firm* — Chip Law Group

(57) ABSTRACT

A control device of a power factor correction circuit disposed in a power supply device that generates a direct-current output voltage from an alternating-current voltage applied to a power supply terminal pair, the power factor correction circuit including an inductor that is disposed between a full-wave rectification circuit that generates a full-wave rectified voltage by carrying out full-wave rectification of the alternating-current voltage and an output interconnect line to which a smoothing capacitor is connected and to which the output voltage is applied, and is inserted between the full-wave rectification circuit and the output interconnect line, and a switching element for controlling an inductor current that flows in the inductor. The control device controls a state of the switching element based on a pulsating voltage obtained by rectifying a voltage between the power supply terminal pair and the full-wave rectification circuit and a feedback voltage according to the output voltage.

8 Claims, 17 Drawing Sheets

(58) Field of Classification Search
CPC ...... H02M 1/0058; H02M 1/12; H02M 1/123;
H02M 1/126; H02M 1/32; H02M 3/00;
H02M 3/02; H02M 3/04; H02M 3/10;
H02M 3/135; H02M 3/137; H02M 3/139;
H02M 3/142; H02M 3/155; H02M
3/1552; H02M 3/156; H02M 3/1566;
H02M 3/157; H02M 3/158; H02M
3/1588; H02M 7/00; H02M 7/02; H02M
7/04; H02M 7/12; H02M 7/125; H02M
7/155; H02M 7/1557; H02M 7/162;
H01L 23/495; H01L 23/49541; H01L
23/49562; H01L 23/49575; H01L 25/18;
Y02B 70/10; Y02B 70/126
USPC ......... 363/37, 40, 41, 44–48, 50, 74, 78, 79,
363/84–94, 123–127, 146, 147;
323/205–211, 235, 236, 266, 271–277,
323/280, 282–285, 299–303, 351
See application file for complete search history.

F I G . 7
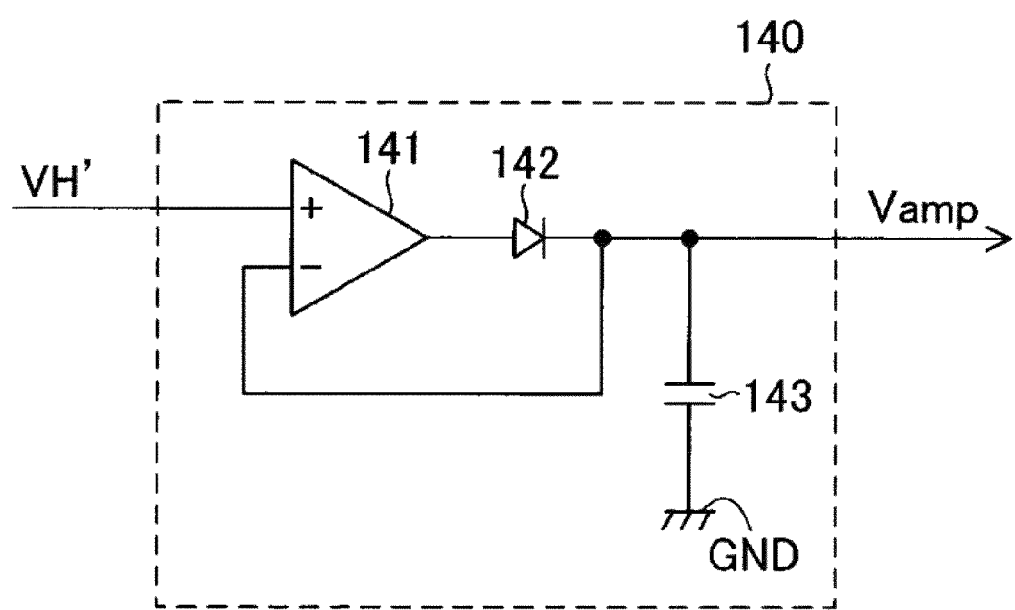

BASIC ARRANGEMENT STRUCTURE

CONTROL DEVICE OF POWER FACTOR CORRECTION CIRCUIT, POWER FACTOR CORRECTION CIRCUIT, POWER SUPPLY DEVICE, AND SEMICONDUCTOR DEVICE

CROSS REFERENCE TO RELATED APPLICATIONS

This application claims priority benefit of Japanese Patent Application No. JP 2019-195253 filed in the Japan Patent Office on Oct. 28, 2019. Each of the above-referenced applications is hereby incorporated herein by reference in its entirety.

BACKGROUND

The present disclosure relates to a control device of a power factor correction circuit, a power factor correction circuit, a power supply device, and a semiconductor device.

In FIG. 20, the overall configuration of a power supply device 901 having a power factor correction function is illustrated. The power supply device 901 is an alternating current/direct current (AC/DC) converter that generates a direct-current output voltage Vo on the basis of an alternating-current voltage Vac provided from an alternating-current power supply.

The power supply device 901 includes a filter part 910 that reduces noise of the alternating-current voltage Vac, a full-wave rectification circuit 920 that carries out full-wave rectification of the alternating-current voltage Vac subjected to the noise reduction, and a power factor correction (PFC) circuit (power factor correction circuit) 930 that receives a full-wave rectified voltage Vh output from the full-wave rectification circuit 920 and generates the output voltage Vo. The PFC circuit 930 includes an inductor 931, a transistor 932, a freewheeling diode 933, a smoothing capacitor 934, voltage divider resistors 935 and 936, a sense resistor 937, and a PFC control part 938. A feedback voltage according to the output voltage Vo is provided from the voltage divider resistors 935 and 936 to the PFC control part 938. A current (inductor current) Ip that flows in the inductor 931 is detected by using the sense resistor 937.

A booster circuit is formed by the inductor 931, the transistor 932, and the freewheeling diode 933, and the PFC control part 938 controls the inductor current Ip through switching-on/off of the transistor 932. At this time, the PFC control part 938 carries out constant-ON-width control and peak current control so that the inductor current Ip may be decided based on the full-wave rectified voltage Vh obtained through the full-wave rectification circuit 920.

An example of the related art is disclosed in Japanese Patent Laid-Open No. 2010-114993.

SUMMARY

If the full-wave rectified voltage Vh is an ideal pulsating voltage (pulsating voltage obtained by accurately turning a sinusoidal voltage to the absolute value), the power factor of the power supply device 901 comes as close to "1" as possible by causing the inductor current Ip to have a current waveform along the ideal pulsating voltage.

However, the full-wave rectified voltage Vh is affected by voltage distortion due to the filter part 910 and voltage distortion due to a capacitor 951 subjected to full-wave rectification and deviates from the above-described ideal pulsating voltage. In FIG. 21, an example of the waveform of the full-wave rectified voltage Vh is schematically illustrated together with the waveform of the alternating-current voltage Vac as a sinusoidal voltage. The full-wave rectified voltage Vh is a pulsating voltage whose potential does not lower to 0 V completely and that includes harmonic distortion.

That the inductor current Ip is also set to the vicinity of zero in the vicinity of the timing when the instantaneous value of the alternating-current voltage Vac becomes 0 V leads to improvement in the power factor. However, if the full-wave rectified voltage Vh does not lower to a potential of 0 V completely due to the influence of the distortion, the PFC control part 938 operates in such a manner that the inductor current Ip equal to or larger than a certain value flows also in the vicinity of the timing when the instantaneous value of the alternating-current voltage Vac becomes 0 V. That is, the waveform of the current distorts. Increase in the distortion of the current waveform means the lowering of the power factor of the power supply device 901. Such distortion possibly becomes fatal in a field in which restrictions on the harmonic current are strict, such as illuminating equipment particularly.

It is desirable to provide a control device of a power factor correction circuit, a power factor correction circuit, a power supply device, and a semiconductor device that contribute to implementation of favorable power factor correction operation.

According to an embodiment of the present disclosure, there is provided a control device of a power factor correction circuit that is a control device of a power factor correction circuit disposed in a power supply device that generates a direct-current output voltage from an alternating-current voltage applied to a power supply terminal pair and has the following configuration (first configuration). The power factor correction circuit includes an inductor that is disposed between a full-wave rectification circuit that generates a full-wave rectified voltage by carrying out full-wave rectification of the alternating-current voltage and an output interconnect line to which a smoothing capacitor is connected and to which the output voltage is applied and that is inserted between the full-wave rectification circuit and the output interconnect line, and a switching element for controlling an inductor current that flows in the inductor. The control device controls the state of the switching element on the basis of a pulsating voltage obtained by rectifying a voltage between the power supply terminal pair and the full-wave rectification circuit and a feedback voltage according to the output voltage.

In the control device of a power factor correction circuit according to the above-described first configuration, a configuration may be employed in which the inductor current flows through the switching element in an on-section of the switching element and a freewheeling element for leading the inductor current in an off-section of the switching element to the output interconnect line is disposed in the power factor correction circuit (second configuration).

In the control device of a power factor correction circuit according to the above-described first or second configuration, the following configuration (third configuration) may be employed. The alternating-current voltage between the power supply terminal pair and the full-wave rectification circuit is subjected to full-wave rectification separately from the full-wave rectification circuit, and the pulsating voltage is generated through voltage division of a result of the full-wave rectification. The control device includes a minimum value detecting part that detects the minimum value of the pulsating voltage, an error amplifier that generates an error voltage based on the feedback voltage and a predetermined reference voltage, and a switching control part that controls the state of the switching element on the basis of a control pulsating voltage obtained through processing of shifting the pulsating voltage to the negative side on the basis of the detected minimum value and the error voltage.

In the control device of a power factor correction circuit according to the above-described third configuration, a configuration may be employed in which the control device includes an amplitude detecting part that detects the amplitude of the pulsating voltage, a pulsating voltage correcting part that generates a corrected pulsating voltage by shifting the pulsating voltage to the negative side on the basis of the detected minimum value, and a control pulsating voltage generating part that generates the control pulsating voltage by correcting the amplitude of the corrected pulsating voltage on the basis of the amplitude detected by the amplitude detecting part (fourth configuration).

In the control device of a power factor correction circuit according to the above-described first or second configuration, the following configuration (fifth configuration) may be employed. The power supply terminal pair includes a first power supply terminal and a second power supply terminal. The pulsating voltage includes a first pulsating voltage obtained by carrying out half-wave rectification of a voltage applied to the first power supply terminal and a second pulsating voltage obtained by carrying out half-wave rectification of a voltage applied to the second power supply terminal. The control device includes a zero-crossing timing detecting part that detects zero-crossing timings of the alternating-current voltage on the basis of the first pulsating voltage and the second pulsating voltage and a cycle detecting part that detects the half cycle of the alternating-current voltage on the basis of a detection result of the zero-crossing timing detecting part. The control device includes also a control pulsating voltage generating part that generates a control pulsating voltage that has the half cycle of the alternating-current voltage as a cycle and takes a minimum value at the zero-crossing timings detected by the zero-crossing timing detecting part, an error amplifier that generates an error voltage based on the feedback voltage and a predetermined reference voltage, and a switching control part that controls the state of the switching element on the basis of the control pulsating voltage and the error voltage.

In the control device of a power factor correction circuit according to the above-described fifth configuration, a configuration may be employed in which the control pulsating voltage generating part includes a digital signal generating part that generates a digital signal having a waveform resulting from full-wave rectification of a sine wave on the basis of the cycle detected by the cycle detecting part, the zero-crossing timings detected by the zero-crossing timing detecting part, and predetermined sine-wave data, and a digital-to-analog (D/A) converter that generates the control pulsating voltage by carrying out D/A conversion of the digital signal (sixth configuration).

In the control device of a power factor correction circuit according to the above-described first or second configuration, the following configuration (seventh configuration) may be employed. The alternating-current voltage between the power supply terminal pair and the full-wave rectification circuit is subjected to full-wave rectification separately from the full-wave rectification circuit, and the pulsating voltage is generated through voltage division of a result of the full-wave rectification. The control device includes a peak timing detecting part that detects peak timings of the pulsating voltage, a cycle detecting part that detects the half cycle of the alternating-current voltage on the basis of a detection result of the peak timing detecting part, and a control pulsating voltage generating part that generates a control pulsating voltage that has the half cycle of the alternating-current voltage as a cycle and has a maximum value at the peak timings detected by the peak timing detecting part. The control device also includes an error amplifier that generates an error voltage based on the feedback voltage and a predetermined reference voltage and a switching control part that controls the state of the switching element on the basis of the control pulsating voltage and the error voltage.

In the control device of a power factor correction circuit according to the above-described seventh configuration, a configuration may be employed in which the control pulsating voltage generating part includes a digital signal generating part that generates a digital signal having a waveform resulting from full-wave rectification of a sine wave, on the basis of the cycle detected by the cycle detecting part, the peak timings detected by the peak timing detecting part, and predetermined sine-wave data; and a D/A converter that generates the control pulsating voltage by carrying out D/A conversion of the digital signal (eighth configuration).

In the control device of a power factor correction circuit according to any of the above-described third to eighth configurations, a configuration may be employed in which the switching control part carries out pulse width modulation (PWM) control to alternately switch on and off the switching element at a predetermined PWM frequency and controls the on-duty of the switching element on the basis of the control pulsating voltage and the error voltage in the PWM control (ninth configuration).

In the control device of a power factor correction circuit according to any of the above-described first to ninth configurations, a configuration may be employed in which a common mode filter is disposed between the power supply terminal pair and the full-wave rectification circuit and the pulsating voltage is extracted from interconnect lines between the power supply terminal pair and the common mode filter (tenth configuration).

According to another embodiment of the present disclosure, there is provided a power factor correction circuit that is a power factor correction circuit disposed in a power supply device that generates a direct-current output voltage from an alternating-current voltage applied to a power supply terminal pair and has the following configuration (eleventh configuration). The power factor correction circuit includes an inductor that is disposed between a full-wave rectification circuit that generates a full-wave rectified voltage by carrying out full-wave rectification of the alternating-current voltage and an output interconnect line to which a smoothing capacitor is connected and to which the output voltage is applied and that is inserted between the full-wave rectification circuit and the output interconnect line, a switching element for controlling an inductor current that flows in the inductor, and the control device according to any of the above-described first to tenth configurations.

According to still another embodiment of the present disclosure, there is provided a power supply device that is a power supply device that generates a direct-current output voltage from an alternating-current voltage applied to a power supply terminal pair and has the following configuration (twelfth configuration). The power supply device includes a full-wave rectification circuit that generates a full-wave rectified voltage by carrying out full-wave rectification of the alternating-current voltage, an output interconnect line to which a smoothing capacitor is connected and to which the output voltage is applied, and the power factor correction circuit according to the above-described eleventh configuration disposed between the full-wave rectification circuit and the output interconnect line.

According to yet another embodiment of the present disclosure, there is provided a semiconductor device that is a semiconductor device in which the control device according to the above-described fifth or sixth configuration is integrated on one or more semiconductor substrates and has the following configuration (thirteenth configuration). The semiconductor device includes a casing in which the one or more semiconductor substrates are housed and a plurality of external terminals exposed from the casing. The plurality of external terminals include a first external terminal that receives a half-wave rectified voltage of the voltage applied to the first power supply terminal, a second external terminal that receives a half-wave rectified voltage of the voltage applied to the second power supply terminal, and a plurality of third external terminals. A distance between the first external terminal and the second external terminal is long compared with a distance between two third external terminals adjacent to each other in the plurality of third external terminals.

In the semiconductor device according to the above-described thirteenth configuration, a configuration may be employed in which a distance between the third external terminal adjacent to the second external terminal in the plurality of third external terminals and the second external terminal is long compared with the distance between two third external terminals adjacent to each other (fourteenth configuration).

In the semiconductor device according to the above-described fourteenth configuration, the following configuration (fifteenth configuration) may be employed. The control device includes a first voltage divider circuit that generates the first pulsating voltage by dividing the half-wave rectified voltage at the first external terminal and a second voltage divider circuit that generates the second pulsating voltage by dividing the half-wave rectified voltage at the second external terminal. The one or more semiconductor substrates include a first semiconductor substrate on which the first voltage divider circuit and the second voltage divider circuit are formed and a second semiconductor substrate separate from the first semiconductor substrate. The first semiconductor substrate is disposed closer to the first external terminal than to the third external terminal adjacent to the second external terminal.

According to a further embodiment of the present disclosure, there is provided a semiconductor device that is a semiconductor device in which the control device according to the above-described fifth or sixth configuration is integrated on one or more semiconductor substrates and has the following configuration (sixteenth configuration). The semiconductor device includes a casing in which the one or more semiconductor substrates are housed and a plurality of external terminals exposed from the casing. The plurality of external terminals include a first external terminal that receives a half-wave rectified voltage of the voltage applied to the first power supply terminal, a second external terminal that receives a half-wave rectified voltage of the voltage applied to the second power supply terminal, a plurality of third external terminals connected to any of the one or more semiconductor substrates, and a fourth external terminal connected to none of the one or more semiconductor substrates. One or more fourth external terminals are disposed between the first external terminal and the second external terminal.

In the semiconductor device according to the above-described sixteenth configuration, a configuration may be employed in which one or more other fourth external terminals are disposed between the third external terminal closest to the second external terminal in the plurality of third external terminals and the second external terminal (seventeenth configuration).

In the semiconductor device according to the above-described seventeenth configuration, the following configuration (eighteenth configuration) may be employed. The control device includes a first voltage divider circuit that generates the first pulsating voltage by dividing the half-wave rectified voltage at the first external terminal and a second voltage divider circuit that generates the second pulsating voltage by dividing the half-wave rectified voltage at the second external terminal. The one or more semiconductor substrates include a first semiconductor substrate on which the first voltage divider circuit and the second voltage divider circuit are formed and a second semiconductor substrate separate from the first semiconductor substrate. The first semiconductor substrate is disposed closer to the first external terminal than to the third external terminal closest to the second external terminal.

According to the present disclosure, it becomes possible to provide a control device of a power factor correction circuit, a power factor correction circuit, a power supply device, and a semiconductor device that contribute to implementation of favorable power factor correction operation.

BRIEF DESCRIPTION OF THE DRAWINGS

FIG. 7 relates to the embodiment example EX1_1 belonging to the first embodiment of the present disclosure and is a configuration diagram of an amplitude detecting part;

DETAILED DESCRIPTION OF THE PREFERRED EMBODIMENTS

Examples of embodiments of the present disclosure will be specifically described below with reference to the drawings. In the respective diagrams that are referred to, the same part is given the same sign and overlapping description relating to the same part is omitted in principle. In the present specification, for simplification of description, by depicting a symbol or sign for reference to information, signal, physical quantity, element, part, or the like, the name of the information, signal, physical quantity, element, part, or the like corresponding to this symbol or sign is omitted or abbreviated in some cases. For example, a zero-crossing timing detecting part (see FIG. 9) referred to with "220" to be described later is represented as the zero-crossing timing detecting part 220 in some cases and is possibly abbreviated as the detecting part 220 in other cases, and they all refer to the same thing.

First, explanation will be made regarding several terms used in the description of embodiments of the present disclosure. The level refers to the level of the potential, and the high level has a potential higher than the low level regarding any signal or voltage. Regarding any signal or voltage, that the signal or voltage is at the high level means that the level of the signal or voltage is at the high level, and that the signal or voltage is at the low level means that the level of the signal or voltage is at the low level. The level regarding a signal is expressed as the signal level in some cases, and the level regarding a voltage is expressed as the voltage level in some cases.

Regarding any transistor configured as a field effect transistor (FET) including a MOSFET, the on-state refers to that the channel between the drain and the source of this transistor is in the conductive state, and the off-state refers to that the channel between the drain and the source of this transistor is in the non-conductive state (cut-off state). This applies also to transistors that are not classified as the FET. The MOSFET is an abbreviation for "metal-oxide-semiconductor field-effect transistor." Furthermore, regarding any transistor, a section in which the transistor is in the on-state is referred to as an on-section in some cases, and a section in which the transistor is in the off-state is referred to as an off-section in some cases. Hereinafter, regarding any transistor, the on-state and the off-state are expressed simply as ON and OFF in some cases.

First Embodiment

Figure 1:
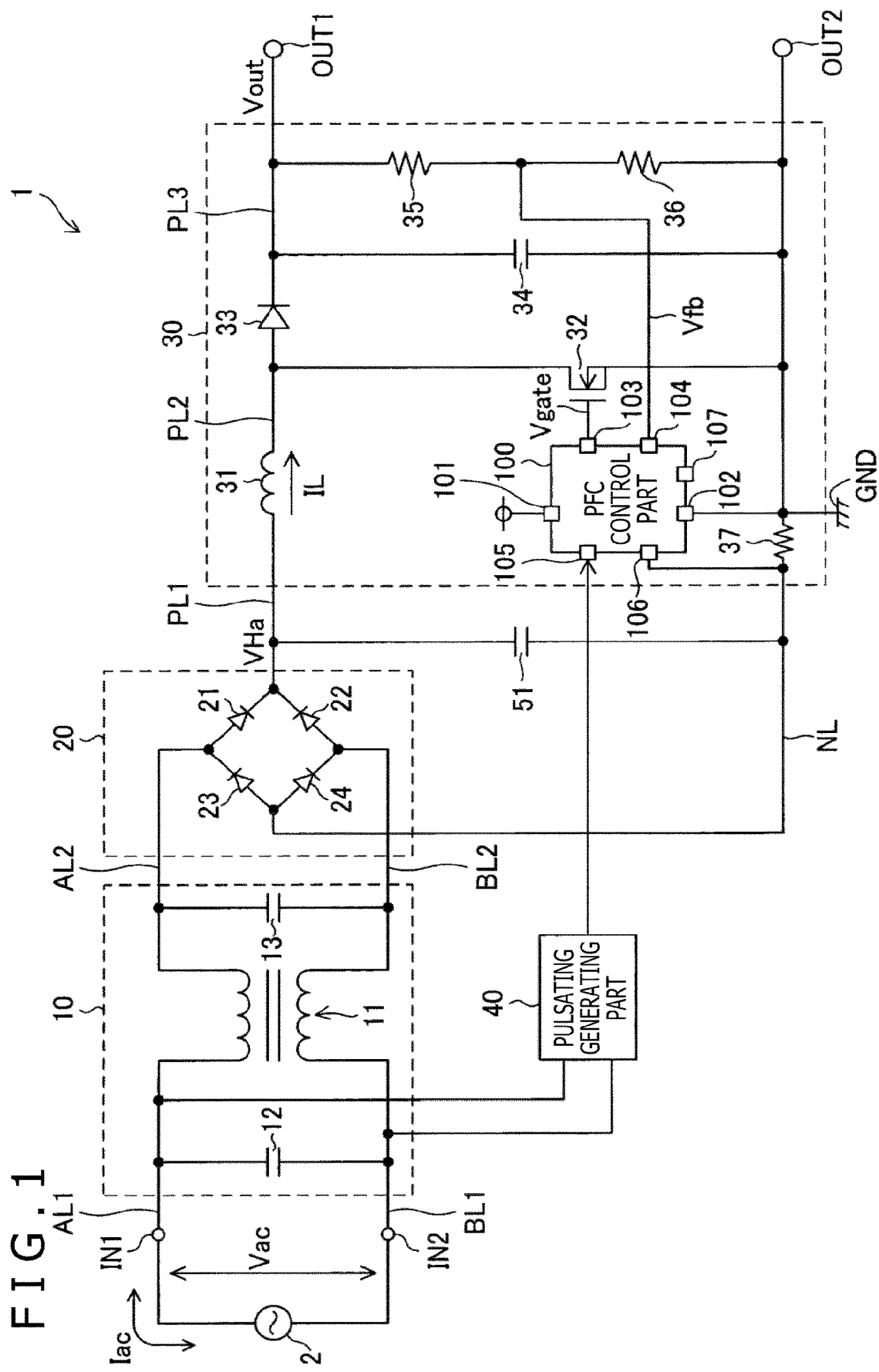
FIG. 1 is an overall configuration diagram of a power supply device according to a first embodiment of the present disclosure.

A first embodiment of the present disclosure will be described. In FIG. 1, the overall configuration of a power supply device 1 according to the first embodiment of the present disclosure is illustrated. The power supply device 1 is an AC/DC converter that generates a direct-current output voltage Vout on the basis of an alternating-current voltage Vac provided from an alternating-current power supply 2. The alternating-current voltage Vac may be a commercial alternating-current voltage, and the effective value of the alternating-current voltage Vac is 100 V or 200 V, for example.

The power supply device 1 includes power supply terminals IN1 and IN2 that form a power supply terminal pair, output terminals OUT1 and OUT2 that form an output terminal pair, a filter part 10, a full-wave rectification circuit 20, a power factor correction circuit 30 (hereinafter, possibly referred to as PFC circuit 30), a pulsating generating part 40, a capacitor 51, and interconnect lines for connecting the respective elements (including interconnect lines AL1, BL1, AL2, BL2, PL1, PL2, PL3, and NL to be described later).

The alternating-current voltage Vac from the alternating-current power supply 2 is provided to the power supply terminal pair. That is, the alternating-current voltage Vac from the alternating-current power supply 2 is applied between the power supply terminals IN1 and IN2. An alternating-current current input from the alternating-current power supply 2 to the power supply device 1 is referred to with symbol "Iac." The alternating-current current Iac flows through the power supply terminal pair.

The filter part 10 is disposed between the power supply terminal pair and the full-wave rectification circuit 20 and reduces noise superimposed on the alternating-current voltage Vac. Specifically, the filter part 10 includes a common mode filter 11 for reducing common mode noise superimposed on the alternating-current voltage Vac and across-the-line capacitors 12 and 13 for reducing normal mode noise superimposed on the alternating-current voltage Vac. The capacitor 12 is disposed between the common mode filter 11 and the power supply terminal pair, and the capacitor 13 is disposed between the common mode filter 11 and the full-wave rectification circuit 20.

An interconnect line that connects the power supply terminal IN1 and the common mode filter 11 is referred to as the interconnect line AL1, and an interconnect line that connects the power supply terminal IN2 and the common mode filter 11 is referred to as the interconnect line BL1. The alternating-current voltage Vac subjected to the noise reduction by the filter part 10 is applied between the interconnect lines AL2 and BL2. The common mode filter 11 includes first and second inductors. The first inductor is inserted between the interconnect lines AL1 and AL2, and the second inductor is inserted between the interconnect lines BL1 and BL2. A fuse and a surge protective element may be disposed between the power supply terminal pair and the capacitor 12 although not particularly illustrated in FIG. 1.

The full-wave rectification circuit 20 generates a full-wave rectified voltage VHa by carrying out full-wave rectification of the alternating-current voltage Vac subjected to the noise reduction by the filter part 10. The full-wave rectification circuit 20 is a diode bridge circuit including four diodes 21 to 24. Specifically, the anode of the diode 21 and the cathode of the diode 23 are connected to the interconnect line AL2 in common. The anode of the diode 22 and the cathode of the diode 24 are connected to the interconnect line BL2 in common. The respective cathodes of the diodes 21 and 22 are connected to the interconnect line PL1 in common. The respective anodes of the diodes 23 and 24 are connected to the interconnect line NL in common.

The full-wave rectified voltage VHa is applied between the interconnect lines NL and PL1. At this time, a potential on the negative side is applied to the interconnect line NL, and a potential on the positive side is applied to the interconnect line PL1. The capacitor 51 is connected to the interconnect lines PL1 and NL.

The PFC circuit 30 is a boosting-type converter that generates the output voltage Vout from the full-wave rectified voltage VHa and improves the power factor of the power supply device 1 by operating in such a manner that the phase of the alternating-current voltage Vac corresponds with the phase of the alternating-current current Iac. The PFC circuit 30 includes an inductor 31, a transistor 32 that is a switching element configured as an N-channel MOSFET, a freewheeling diode 33, a smoothing capacitor 34, voltage divider resistors 35 and 36, a sense resistor 37, and a PFC control part 100.

One end of the inductor 31 is connected to the interconnect line PL1 and is connected to the respective cathodes of the diodes 21 and 22 through the interconnect line PL1. The other end of the inductor 31 is connected to the interconnect line PL2 and is connected to the drain of the transistor 32 and the anode of the freewheeling diode 33 in common through the interconnect line PL2. The source of the transistor 32 is connected to a ground GND. The ground GND refers to an electrically-conductive part having a predetermined ground potential. In the present embodiment, a voltage illustrated in such a manner that the basis is not particularly set (excluding the alternating-current voltage Vac) represents a potential from the viewpoint of the ground GND. In the present embodiment, the ground potential is defined as 0 V.

The cathode of the freewheeling diode 33 is connected to the interconnect line PL3. The interconnect line PL3 is an output interconnect line to which the output voltage Vout is applied. The output voltage Vout is a voltage from the viewpoint of the ground potential and has a higher potential than the ground potential. One end of the smoothing capacitor 34 is connected to the output interconnect line PL3, and the other end of the smoothing capacitor 34 is connected to the ground GND. A voltage divider circuit including the voltage divider resistors 35 and 36 generates a feedback voltage Vfb by dividing the output voltage Vout. Specifically, one end of the voltage divider resistor 35 is connected to the output interconnect line PL3, and the other end of the voltage divider resistor 35 is connected to the ground GND through the voltage divider resistor 36. The feedback voltage Vfb arises at the connecting node between the voltage divider resistors 35 and 36. The output terminal OUT1 is connected to the output interconnect line PL3, and the output terminal OUT2 is connected to the ground GND.

The sense resistor 37 is inserted between the source of the transistor 32 and the interconnect line NL and causes a voltage drop according to a current that flows between the source of the transistor 32 and the interconnect line NL. It is also possible to consider that the respective anodes of the diodes 23 and 24 are connected to the output terminal OUT2 through the interconnect line NL and the sense resistor 37 is inserted in series on the interconnect line NL. The sense resistor 37 may be inserted between the source of the transistor 32 and the ground GND.

Figure 2:
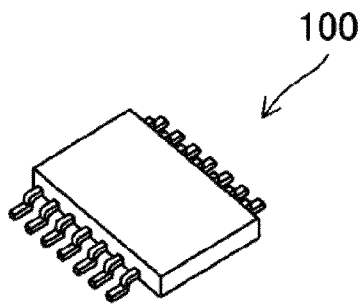
FIG. 2 is an appearance perspective view of a PFC control part according to the first embodiment of the present disclosure.

The PFC control part 100 is equivalent to a control device of the PFC circuit 30. The PFC control part 100 is an electronic component (semiconductor device) formed by enclosing a semiconductor integrated circuit in a casing (package) formed of a resin, like the one illustrated in FIG. 2. Plural external terminals are disposed on the casing of the PFC control part 100 in an exposed manner. Terminals 101 to 107 illustrated in FIG. 1 are included in the plural external terminals, and other terminals are also possibly included in the plural external terminals. The number of external terminals of the PFC control part 100 and the appearance of the PFC control part 100 illustrated in FIG. 2 are merely exemplifications.

A predetermined supply voltage is provided to the terminal 101. The PFC control part 100 is driven based on the supply voltage provided to the terminal 101. The terminal 102 is connected to the ground GND. The terminal 103 is connected to the gate of the transistor 32. The feedback voltage Vfb is applied to the terminal 104. A pulsating voltage output from the pulsating generating part 40 is applied to the terminal 105 (details will be described later). The terminal 105 is formed of two external terminals in some cases (details will be described later). The terminal 106 is connected to the interconnect line NL, and the voltage drop caused at the sense resistor 37 is applied to the terminal 106. The PFC control part 100 can refer to the voltage at the terminal 106 and carry out overcurrent protection operation (for example, operation of switching off the transistor 32 when the current that flows through the transistor 32 has become equal to or larger than a predetermined value) on the basis of the voltage drop of the sense resistor 37. A component (not illustrated) for limiting the band of an output signal of an error amplifier to be described later is externally connected to the terminal 107.

Figure 3:
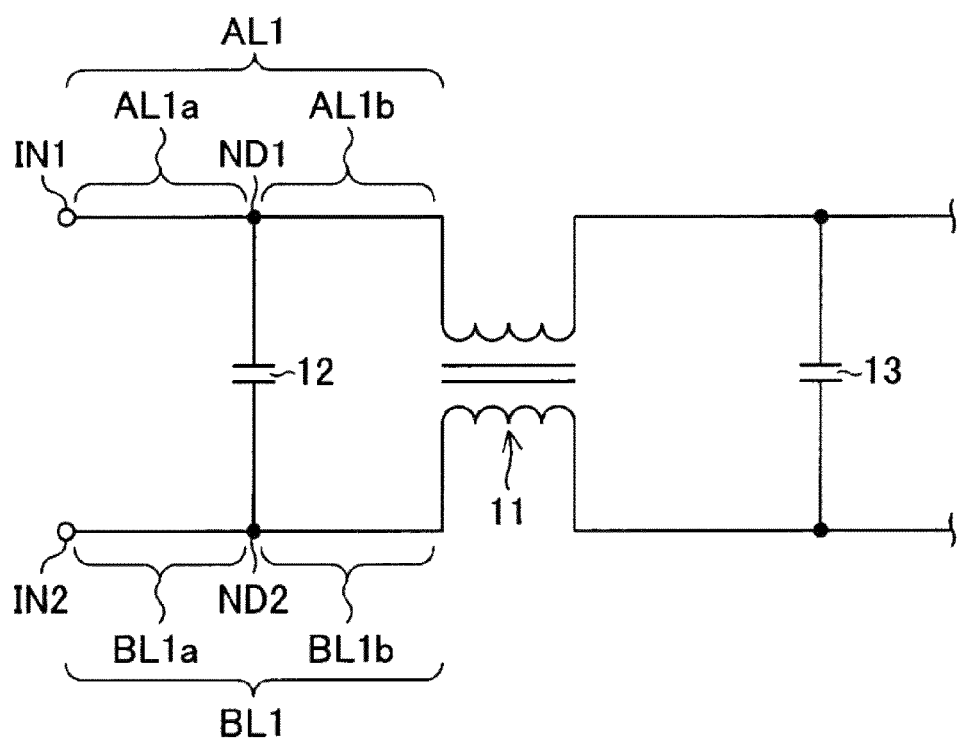
FIG. 3 relates to the first embodiment of the present disclosure and is an explanatory diagram of connecting interconnect lines between a power supply terminal pair and a filter part.

The pulsating generating part 40 is connected to the interconnect lines AL1 and BL1. As illustrated in FIG. 3, the interconnect line AL1 includes interconnect lines AL1a and AL1b. The interconnect line AL1a is an interconnect line between the power supply terminal IN1 and a node ND1. The interconnect line AL1b is an interconnect line between the node ND1 and the first inductor of the common mode filter 11. An interconnect line BL1a is an interconnect line between the power supply terminal IN2 and a node ND2. An interconnect line BL1b is an interconnect line between the node ND2 and the second inductor of the common mode filter 11. One end of the capacitor 12 is connected to the node ND1, and the other end of the capacitor 12 is connected to the node ND2. Although the pulsating generating part 40 is connected to the interconnect lines AL1b and BL1b in the example of FIG. 1, the pulsating generating part 40 may be connected to the interconnect lines AL1a and BL1a.

The pulsating generating part 40 generates a pulsating voltage by rectifying the voltage across the interconnect lines AL1 and BL1 and provides the generated pulsating voltage to the PFC control part 100. As described in detail later, the pulsating generating part 40 may generate one pulsating voltage by carrying out full-wave rectification of the alternating-current voltage Vac applied between the interconnect lines AL1 and BL1 or may generate two pulsating voltages by individually carrying out half-wave rectification of the voltage applied to the interconnect line AL1 and the voltage applied to the interconnect line BL1.

The PFC control part 100 carries out output stabilization control to stabilize the output voltage Vout to a predetermined target voltage Vtg on the basis of the feedback voltage Vfb and the pulsating voltage provided from the pulsating generating part 40 and power factor correction control to enhance the power factor of the power supply device 1 through adjustment of the current that flows in the inductor 31. Hereinafter, the current that flows in the inductor 31 is referred to with symbol "IL" and is referred to as the current IL or the inductor current IL. The inductor current IL flows in the direction from the interconnect line PL1 toward the interconnect line PL2. The inductor current IL is equivalent to an input current to the PFC circuit 30.

The output stabilization control and the power factor correction control are implemented by controlling the state of the transistor 32 (on/off-state) on the basis of the feedback voltage Vfb and the pulsating voltage provided from the pulsating generating part 40. The PFC control part 100 provides a gate signal Vgate to the transistor 32 through the terminal 103 and causes switching of the transistor 32 by switching the gate signal Vgate between the high level and the low level. The transistor 32 becomes the on-state when the gate signal Vgate is at the high level, and the transistor 32 becomes the off-state when the gate signal Vgate is at the low level.

In the on-section of the transistor 32 in which the transistor 32 is in the on-state, the inductor current IL flows to the interconnect line NL through the transistor 32. When the inductor current IL flows in the off-section of the transistor 32 in which the transistor 32 is in the off-state (when energy is accumulated in the inductor 31), the inductor current IL flows to the output interconnect line PL3 through the freewheeling diode 33.

Figure 4:
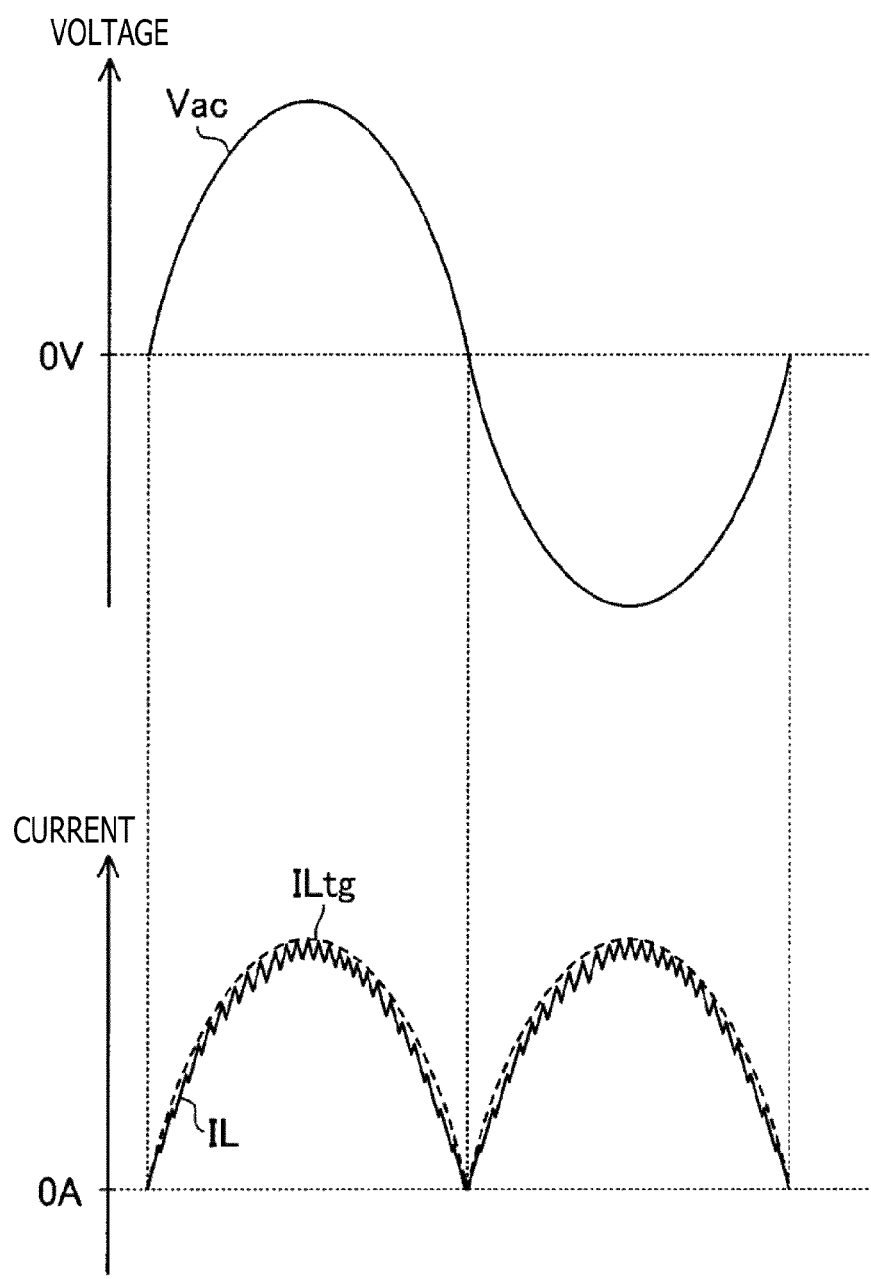
FIG. 4 relates to the first embodiment of the present disclosure and is a waveform diagram of an alternating-current voltage and an inductor current in the continuous-conduction mode.

In FIG. 4, the waveform of the inductor current IL in the continuous-conduction mode is schematically illustrated together with the waveform of the alternating-current voltage Vac. The PFC circuit 30 can operate also in the boundary-conduction mode although diagrammatic representation is not particularly made here. The boundary-conduction mode is referred to as the discontinuous-conduction mode in some cases. Both in the continuous-conduction mode and in the boundary-conduction mode, the inductor current IL rises over time in the on-section of the transistor 32 and the inductor current IL decreases over time in the subsequent off-section of the transistor 32. However, the lower limit of the inductor current IL is zero.

Thus, the inductor current IL is controlled based on ON/OFF of the transistor 32, and the waveform of the inductor current IL can be brought closer to the waveform of a target inductor current ILtg through this control. Here, the target inductor current ILtg refers to a pulsating current represented by "ILtg=|Vac|×Kiv." Kiv is a coefficient having "ampere/volt" as the unit. The target inductor current ILtg has a frequency twice that of the alternating-current voltage Vac and a phase synchronized with the alternating-current voltage Vac. In the power factor correction control, the PFC control part 100 brings the power factor of the power supply device 1 closer to "1" by controlling ON/OFF of the transistor 32 in such a manner that the waveform of the inductor current IL gets closer to the waveform of the target inductor current ILtg.

The freewheeling diode 33 functions as a freewheeling element that leads the inductor current IL in the off-section of the transistor 32 to the output interconnect line PL3. In the PFC circuit 30, a synchronous rectification transistor may be used as the freewheeling element instead of the freewheeling diode 33. In this case, it is preferable that, under control by the PFC control part 100, the synchronous rectification transistor is set to the off-state when the transistor 32 is in the on-state and the synchronous rectification transistor is set to the on-state when the transistor 32 is in the off-state.

The first embodiment includes the following embodiment examples EX1_1 to EX1_3. With embodiment examples EX1_1 to EX1_3, detailed configuration examples and operation examples, applied techniques, and so forth of the PFC control part 100 will be described. Matters described above in the present embodiment are applied to the following embodiment examples EX1_1 to EX1_3 as long as a particular description is not made and contradiction does not exist and, in each embodiment example, priority may be given to description in the embodiment example regarding a matter that contradicts the above-described matter. Furthermore, it is also possible to apply a matter described in any embodiment example in embodiment examples EX1_1 to EX1_3 to another optional embodiment example as long as contradiction does not exist (that is, it is also possible to combine any two or more embodiment examples in the plural embodiment examples). [Embodiment Example EX1_1]

Figure 5:
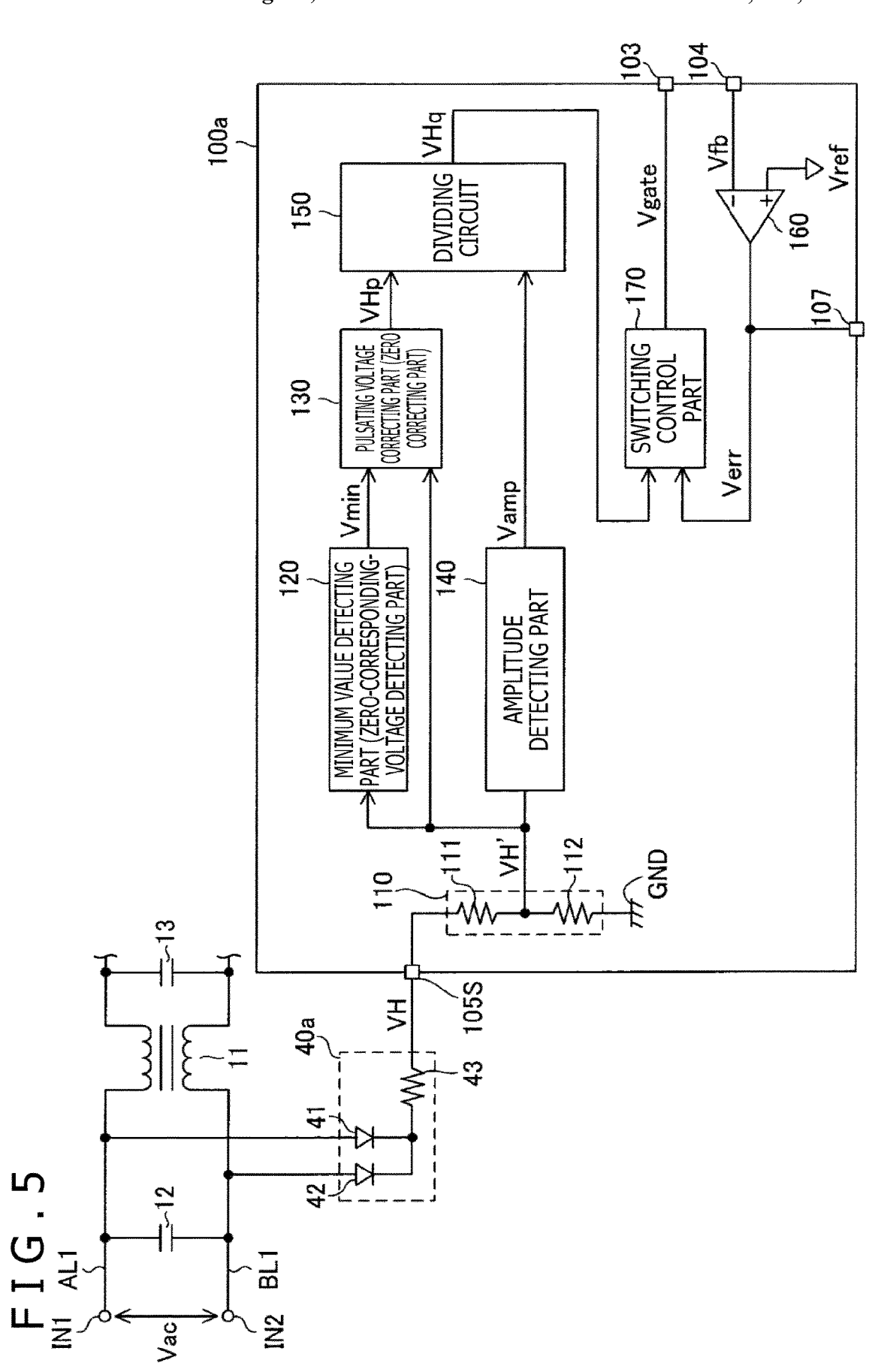
FIG. 5 relates to an embodiment example EX1_1 belonging to the first embodiment of the present disclosure and is a partial configuration diagram of the power supply device.
Figure 6:
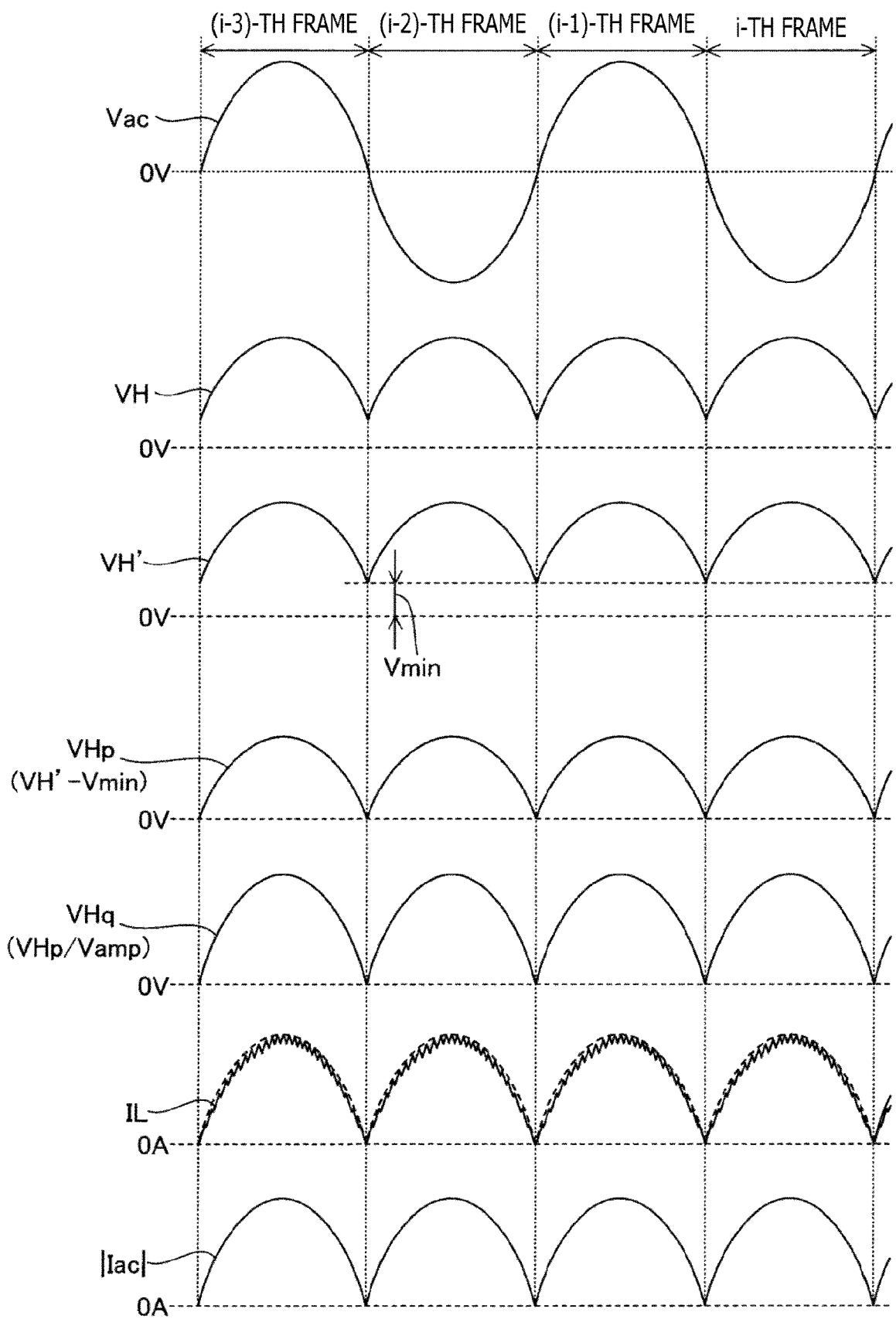
FIG. 6 relates to the embodiment example EX1_1 belonging to the first embodiment of the present disclosure and is a diagram illustrating several voltage waveforms and current waveforms in the power supply device.

Embodiment example EX1_1 will be described. FIG. 5 is a partial configuration diagram of the power supply device 1 according to embodiment example EX1_1. In embodiment example EX1_1, a pulsating generating part 40a is used as the pulsating generating part 40, and a PFC control part 100a is used as the PFC control part 100. In embodiment example EX1_1, the terminal 105 in FIG. 1 is a single external terminal 105S. In FIG. 6, several voltage waveforms and current waveforms in the power supply device 1 of embodiment example EX1_1 are illustrated. In FIG. 6, for convenience of diagrammatic representation, plural voltage waveforms are illustrated at scales different from each other (this applies also to FIG. 10 and FIG. 14 to be described later). For example, in FIG. 6, the waveforms of pulsating voltages VH and VH' to be described later are illustrated as if they had equivalent amplitude for convenience of diagrammatic representation. However, the amplitude is greatly different between the pulsating voltage VH and the pulsating voltage VH' (for example, different by a factor of approximately 100).

The pulsating generating part 40a includes diodes 41 and 42 that are rectifier diodes and a resistor 43 for lightning surge protection. The anode of the diode 41 is connected to the interconnect line AL1, and the anode of the diode 42 is connected to the interconnect line BL1. More specifically (see FIG. 3), the anode of the diode 41 is connected to the interconnect line AL1b, and the anode of the diode 42 is connected to the interconnect line BL1b. However, the anode of the diode 41 may be connected to the interconnect line AL1a, and the anode of the diode 42 may be connected to the interconnect line BL1a.

The cathodes of the diodes 41 and 42 may be connected to one end of the resistor 43 in common, and the other end of the resistor 43 is connected to the terminal 105S. Thus, in the pulsating generating part 40a, the alternating-current voltage Vac between the interconnect lines AL1 and BL1 is full-wave rectified by the diodes 41 and 42, and the full-wave rectified alternating-current voltage Vac is generated as a pulsating voltage. The pulsating voltage generated in the pulsating generating part 40a is referred to as the pulsating voltage VH. The pulsating voltage VH is generated in an interconnect line between the resistor 43 and the terminal 105S, and the pulsating voltage VH from the pulsating generating part 40a is received at the terminal 105S.

The PFC control part 100a includes a voltage divider circuit 110, a minimum value detecting part 120 (zero-corresponding-voltage detecting part), a pulsating voltage correcting part 130 (zero correcting part), an amplitude detecting part 140, a dividing circuit 150, an error amplifier 160, and a switching control part 170.

The voltage divider circuit 110 includes voltage divider resistors 111 and 112 and divides the pulsating voltage VH at the terminal 105S to output the divided pulsating voltage VH as the pulsating voltage VH'. More specifically, one end of the voltage divider resistor 111 is connected to the terminal 105S, and the other end of the voltage divider resistor 111 is connected to the ground GND through the voltage divider resistor 112. The pulsating voltage VH' arises at the connecting node between the voltage divider resistors 111 and 112. The voltage division ratio at the voltage divider circuit 110 may be any ratio. For example, a voltage division ratio of approximately one to several tens to one to several hundreds is employed.

The pulsating voltages VH and VH' synchronize with the alternating-current voltage Vac and have a frequency twice that of the alternating-current voltage Vac (see FIG. 6). The pulsating voltages VH and VH' take the minimum value at the zero-crossing timing of the alternating-current voltage Vac, and the minimum value is ideally zero. However, due to the existence of the diodes 41 and 42 and waveform distortion before reaching the terminal 105S, the minimum value of them does not become zero in many cases (see FIG. 6). The zero-crossing of the alternating-current voltage Vac refers to that the potential difference between the power supply terminals IN1 and IN2 becomes zero, and the zero-crossing timing of the alternating-current voltage Vac refers to the timing when the potential difference between the power supply terminals IN1 and IN2 becomes zero (in other words, timing when the polarity of the alternating-current voltage Vac is switched from the negative side to the positive side or timing when the polarity of the alternating-current voltage Vac is switched from the positive side to the negative side).

The minimum value detecting part 120 detects the minimum value of the pulsating voltage VH' on the basis of the pulsating voltage VH'. The detected minimum value is referred to with symbol "Vmin" and is referred to as the minimum value Vmin, the detected minimum value Vmin, the detected value Vmin, or the like (see FIG. 6). The detected value Vmin is equivalent to the value of the pulsating voltage VH' at the zero-crossing timing of the alternating-current voltage Vac. For this reason, it can be said that the minimum value detecting part 120 is a circuit that detects the timing when the pulsating voltage VH' takes the minimum value as the zero-crossing timing of the alternating-current voltage Vac on the basis of the pulsating voltage VH' and derives the value of the pulsating voltage VH' at the zero-crossing timing of the alternating-current voltage Vac as the detected value Vmin.

The pulsating voltage correcting part 130 receives the pulsating voltage VH' from the voltage divider circuit 110 and the detected value Vmin by the minimum value detecting part 120 and generates a corrected pulsating voltage VHp by shifting the pulsating voltage VH' to the negative side on the basis of the detected value Vmin (see FIG. 6). The corrected pulsating voltage VHp is equivalent to what is obtained by correcting the pulsating voltage VH' in such a manner that the minimum value of the pulsating voltage VH' becomes zero. Thus, it may be considered that "VHp=VH'−Vmin" holds.

Here, for convenience, the section sandwiched between adjacent two zero-crossing timings in the alternating-current voltage Vac is referred to as a frame (see FIG. 6). Along with the progression of time, first frame, second frame, third frame, . . . sequentially come. Regarding any natural number i, the zero-crossing of the alternating-current voltage Vac occurs at the boundary timing between the (i−1)-th and i-th frames, and the next zero-crossing of the alternating-current voltage Vac occurs at the boundary timing between the i-th and (i+1)-th frames.

The minimum value detecting part 120 can detect the minimum value Vmin in each frame. Here, regarding any natural number i, the minimum value Vmin at the boundary timing between the (i−1)-th and i-th frames is considered to be the minimum value Vmin detected in the (i−1)-th frame. In this case, the pulsating voltage correcting part 130 may generate the corrected pulsating voltage VHp of the i-th frame by shifting the pulsating voltage VH' of the i-th frame to the negative side by the minimum value Vmin detected in the (i−1)-th frame. Alternatively, the pulsating voltage correcting part 130 may generate the corrected pulsating voltage VHp of the i-th frame by shifting the pulsating voltage VH' of the i-th frame to the negative side by an amount based on plural minimum values Vmin detected in plural frames previous to the i-th frame (for example, average of two minimum values Vmin detected in the (i−2)-th and (i−1)-th frames). Further alternatively, variation in the minimum value Vmin among the frames may be deemed to be small and, after the minimum value Vmin is detected in the i-th frame, the pulsating voltage correcting part 130 may generate the corrected pulsating voltage VHp by using the minimum value Vmin detected in the i-th frame in all frames subsequent to the i-th frame.

The amplitude detecting part 140 detects the amplitude of the pulsating voltage VH' on the basis of the pulsating voltage VH' and outputs a voltage Vamp that represents the amplitude of the pulsating voltage VH'. The voltage Vamp has a voltage value in proportion to the amplitude of the pulsating voltage VH'. The voltage Vamp increases as this amplitude increases, and decreases as this amplitude decreases. In FIG. 7, a configuration example of the amplitude detecting part 140 is illustrated. The amplitude detecting part 140 of FIG. 7 includes an operational amplifier 141, a diode 142, and a capacitor 143. The pulsating voltage VH' is input to the non-inverting input terminal of the operational amplifier 141. The output terminal of the operational amplifier 141 is connected to the anode of the diode 142. The cathode of the diode 142 is connected to the inverting input terminal of the operational amplifier 141 and is connected to the ground GND through the capacitor 143. The voltage Vamp appears at the connecting node between the cathode of the diode 142 and the capacitor 143.

The dividing circuit 150 generates a control pulsating voltage VHq by dividing the corrected pulsating voltage VHp by the voltage Vamp (see FIG. 6). Thus, the control pulsating voltage VHq is represented by "VHq=VHp/Vamp." The control pulsating voltage VHq is different from the corrected pulsating voltage VHp only in the amplitude, and the waveforms of the voltages VHp and VHq are the same as each other excluding the amplitude. The dividing circuit 150 functions as a control pulsating voltage generating part that generates the control pulsating voltage VHq by correcting the amplitude of the corrected pulsating voltage VHp on the basis of the amplitude detected in the amplitude detecting part 140.

The error amplifier 160 generates an error voltage Verr according to the error between a predetermined reference voltage Vref and the feedback voltage Vfb applied to the terminal 104. The error amplifier 160 can be configured by a transconductance amplifier, for example. The reference voltage Vref is generated in a reference voltage generating part that is not illustrated in the diagram in the PFC control part 100a and has a positive predetermined direct-current voltage value. The output voltage Vout corresponds with the predetermined target voltage Vtg when the feedback voltage Vfb corresponds with the reference voltage Vref. Here, suppose that the error voltage Verr has a voltage equal to or higher than 0 V and the error amplifier 160 is configured in such a manner that the error voltage Verr increases when "Vfb<Vref" is satisfied and the error voltage Verr lowers, with 0 V being the lower limit, when "Vfb>Vref" is satisfied. The output terminal of the error amplifier 160 is connected to the terminal 107. To the terminal 107, a component (capacitor or series circuit of resistor and capacitor: not illustrated) for reducing high-frequency components of the output signal of the error amplifier 160 may be connected outside the PFC control part 100a.

The switching control part 170 carries out PWM control to alternately switch on and off the transistor 32 at a predetermined PWM frequency on the basis of the control pulsating voltage VHq and the error voltage Verr. The PWM is an abbreviation for "pulse width modulation."

At this time, the switching control part 170 increases the on-duty of the transistor 32 to a larger extent when the error voltage Verr becomes higher and decreases the on-duty of the transistor 32 to a larger extent when the error voltage Verr becomes lower. This stabilizes the output voltage Vout to the predetermined target voltage Vtg. The on-duty of the transistor 32 refers to the ratio of the on-section of the transistor 32 to the sum of the on-section of the transistor 32 and the off-section of the transistor 32.

Meanwhile, the switching control part 170 sets the on-duty of the transistor 32 higher at a timing when the value of the control pulsating voltage VHq is relatively high than at a timing when the value of the control pulsating voltage VHq is relatively low. This is equivalent to controlling the phase of the inductor current IL according to the phase of the pulsating voltage (VH, VH', VHp, or VHq) extracted from the interconnect lines AL1 and BL1, which causes the phase of the inductor current IL (phase of the average current of the inductor current IL) to correspond with the phase of the pulsating voltage (VH, VH', VHp, or VHq). As a result, the waveform of the inductor current IL gets closer to the above-described target inductor current ILtg (see FIG. 4), so that the power factor of the power supply device 1 gets closer to "1."

Figure 8A:
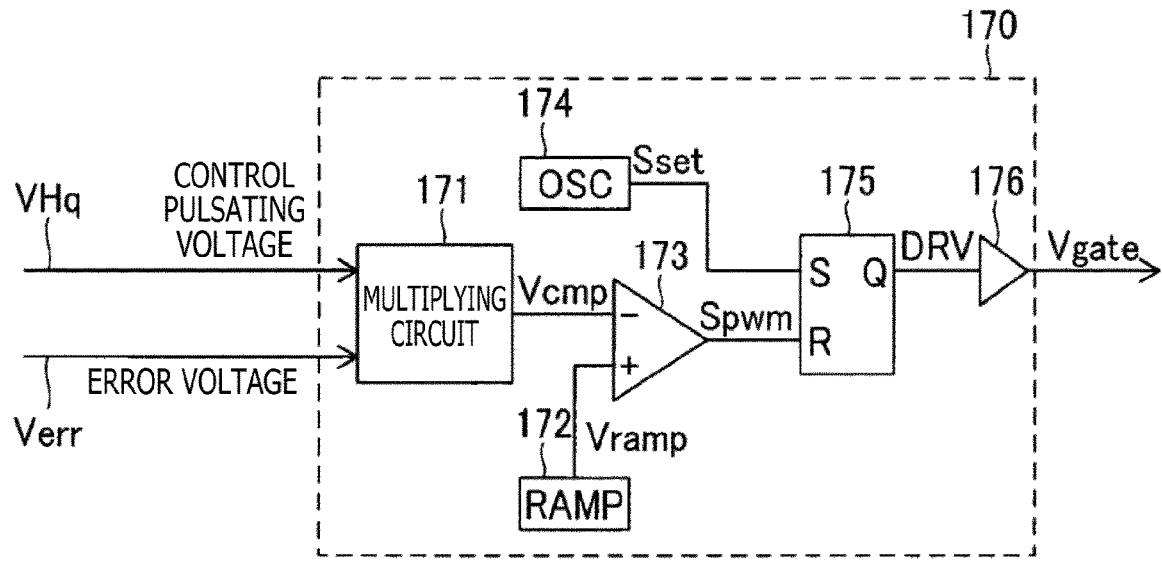
FIGS. 8a and 8b relates to the embodiment example EX1_1 belonging to the first embodiment of the present disclosure and depicts diagrams illustrating the configuration of a switching control part and signal waveforms.
Figure 8B:
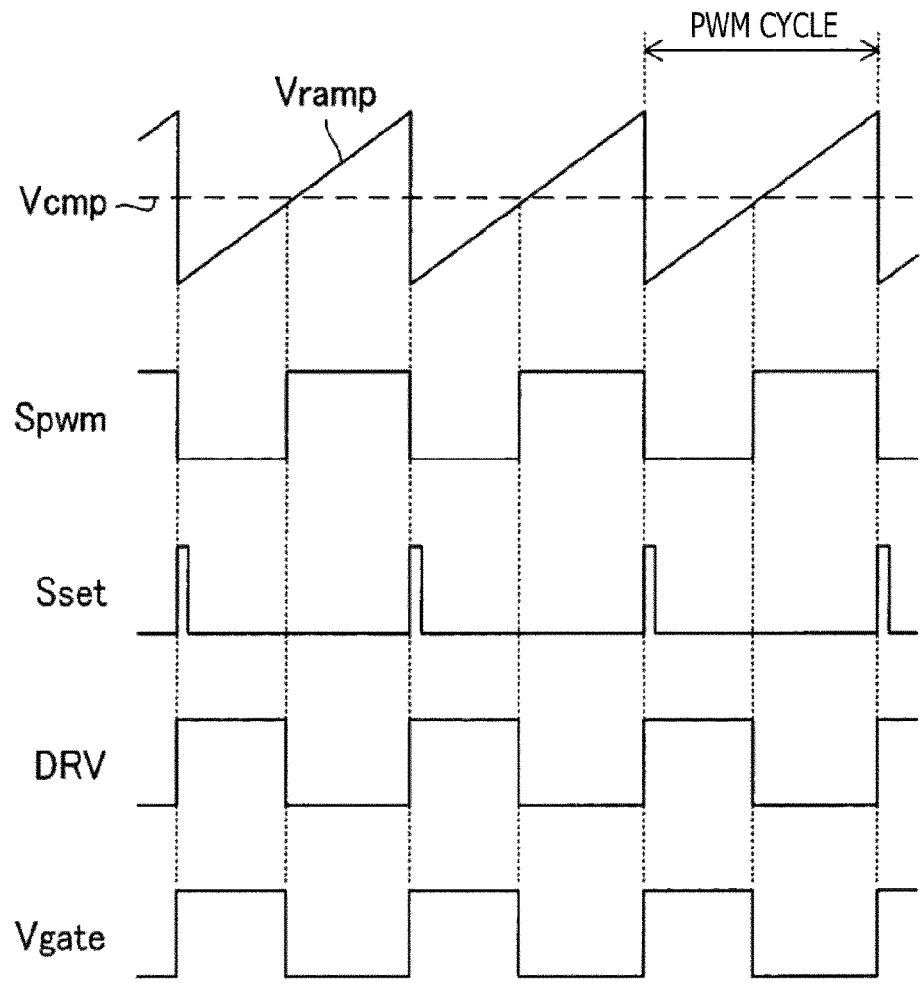

A multiplying circuit is used in the switching control part 170 in order to control the on-duty of the transistor 32 in consideration of both the control pulsating voltage VHq and the error voltage Verr. In FIG. 8A, a configuration example of the switching control part 170 is illustrated. In FIG. 8B, plural signal waveforms relating to the switching control part 170 are illustrated. The switching control part 170 includes a multiplying circuit 171, a ramp voltage generating part 172, a PWM comparator 173, an oscillator 174, an FF 175 that is a reset-set (RS) flip-flop, and a driver 176.

The multiplying circuit 171 multiplies the control pulsating voltage VHq and the error voltage Verr and outputs a voltage Vcmp that indicates the multiplication result. The voltage Vcmp becomes higher when the control pulsating voltage VHq is higher and becomes higher when the error voltage Verr is higher.

The ramp voltage generating part 172 generates a ramp voltage Vramp with a sawtooth wave or triangle wave shape. In the example of FIG. 8B, the ramp voltage Vramp has a waveform of a sawtooth wave shape. The value of the ramp voltage Vramp linearly increases with a predetermined lower-limit voltage value being the origin, and sharply returns to the lower-limit voltage value upon reaching a predetermined upper-limit voltage value. The variation in the ramp voltage Vramp between the lower-limit voltage value and the upper-limit voltage value repeatedly occurs at a predetermined PWM cycle. The PWM cycle is the reciprocal of the PWM frequency.

The ramp voltage Vramp is input to the non-inverting input terminal of the PWM comparator 173, and the voltage Vcmp from the multiplying circuit 171 is input to the inverting input terminal of the PWM comparator 173 as a compared voltage. The PWM comparator 173 compares the ramp voltage Vramp and the compared voltage Vcmp and outputs a signal Spwm that is a PWM signal indicating the comparison result. The signal Spwm becomes the high level in the sections in which "Vramp>Vcmp" holds and becomes the low level in the other sections.

The oscillator 174 generates a set signal Sset having a predetermined PWM frequency. In the example of FIG. 8B, the set signal Sset includes a train of pulses that become the high level for only a minute time and the interval between any adjacent two pulses in the set signal Sset corresponds with the PWM cycle. The ramp voltage generating part 172 operates in synchronization with the oscillator 174 and returns the ramp voltage Vramp to the lower-limit voltage value in synchronization with generation of the pulse in the set signal Sset.

The FF 175 is an RS flip-flop including a set terminal that receives the set signal Sset, a reset terminal that receives the signal Spwm, and an output terminal. A drive signal DRV is output from the output terminal of the FF 175. Thus, in each PWM cycle, the drive signal DRV becomes the low level in the sections in which "Vramp>Vcmp" holds and becomes the high level in the other sections.

The driver 176 outputs the gate signal Vgate based on the drive signal DRV. The gate signal Vgate is supplied to the gate of the transistor 32 through the terminal 103 (see FIG. 1). The driver 176 can be configured by a half-bridge circuit or the like. When the drive signal DRV is at the high level, the gate signal Vgate also becomes the high level and the transistor 32 becomes the on-state. When the drive signal DRV is at the low level, the gate signal Vgate also becomes the low level and the transistor 32 becomes the off-state.

By the above-described configuration, the transistor 32 is alternately switched on and off according to the feedback voltage Vfb and the control pulsating voltage VHq, and the above-described output stabilization control and power factor correction control are implemented. At this time, a high power factor correction effect (high suppression effect of harmonic current) is obtained by employing a configuration in which a voltage that is not affected by distortion due to the filter part 10 and the capacitor 51 is taken in from the interconnect lines AL1 and BL1.

Further, generation of the harmonic current is strongly suppressed by using the minimum value detecting part 120 (zero-corresponding-voltage detecting part) and controlling the inductor current IL with use of the pulsating voltage (VHp, VHq) that lowers to 0 V. That is, the inductor current IL can also be lowered to the vicinity of 0 A at a timing when the pulsating voltage (VHp, VHq) referred to is lowered to the vicinity of 0 V, and distortion of the current is thereby effectively reduced.

Although the waveform of the inductor current IL when the PFC circuit 30 operates in the continuous-conduction mode is schematically illustrated in FIG. 6, the PFC circuit 30 can operate also in the boundary-conduction mode (discontinuous-conduction mode). That is, the configuration of the present embodiment is compatible with both the continuous-conduction mode and the boundary-conduction mode and is thus highly convenient.

Moreover, due to the use of the amplitude detecting part 140 and the dividing circuit 150, the amplitude of the control pulsating voltage VHq can be made constant without depending on the amplitude of the alternating-current voltage Vac. For this reason, the multiplying circuit 171 can be designed without considering that the alternating-current voltage Vac can have various types of amplitude, and facilitation of design including design of the dynamic range of the multiplying circuit 171 is expected.

However, it may also be possible to remove the amplitude detecting part 140 and the dividing circuit 150 from the PFC control part 100*a* and input the corrected pulsating voltage VHp itself to the switching control part 170 as the control pulsating voltage VHq. [Embodiment Example EX1_2]

Figure 9:
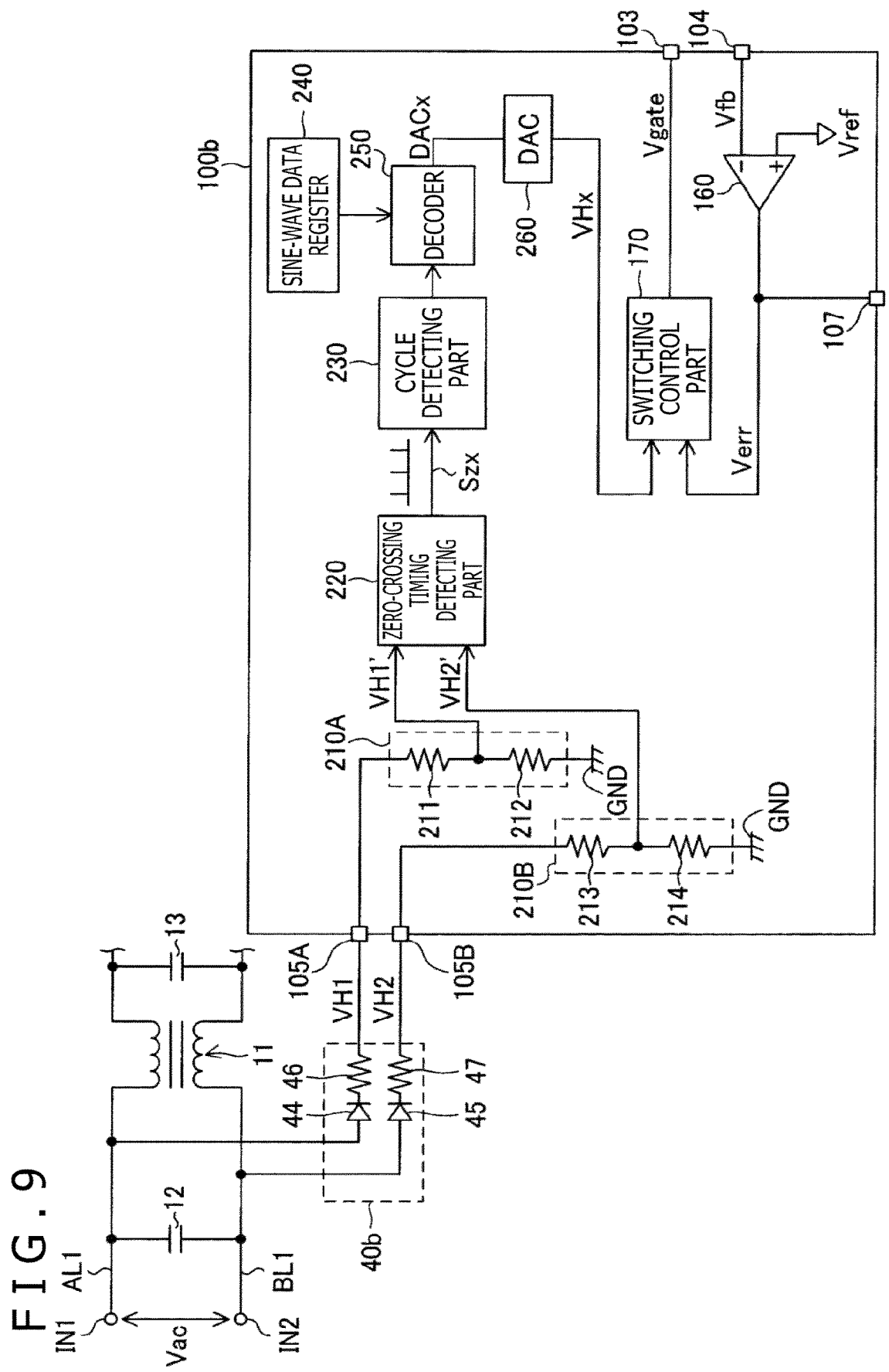
FIG. 9 relates to an embodiment example EX1_2 belonging to the first embodiment of the present disclosure and is a partial configuration diagram of the power supply device.
Figure 10:
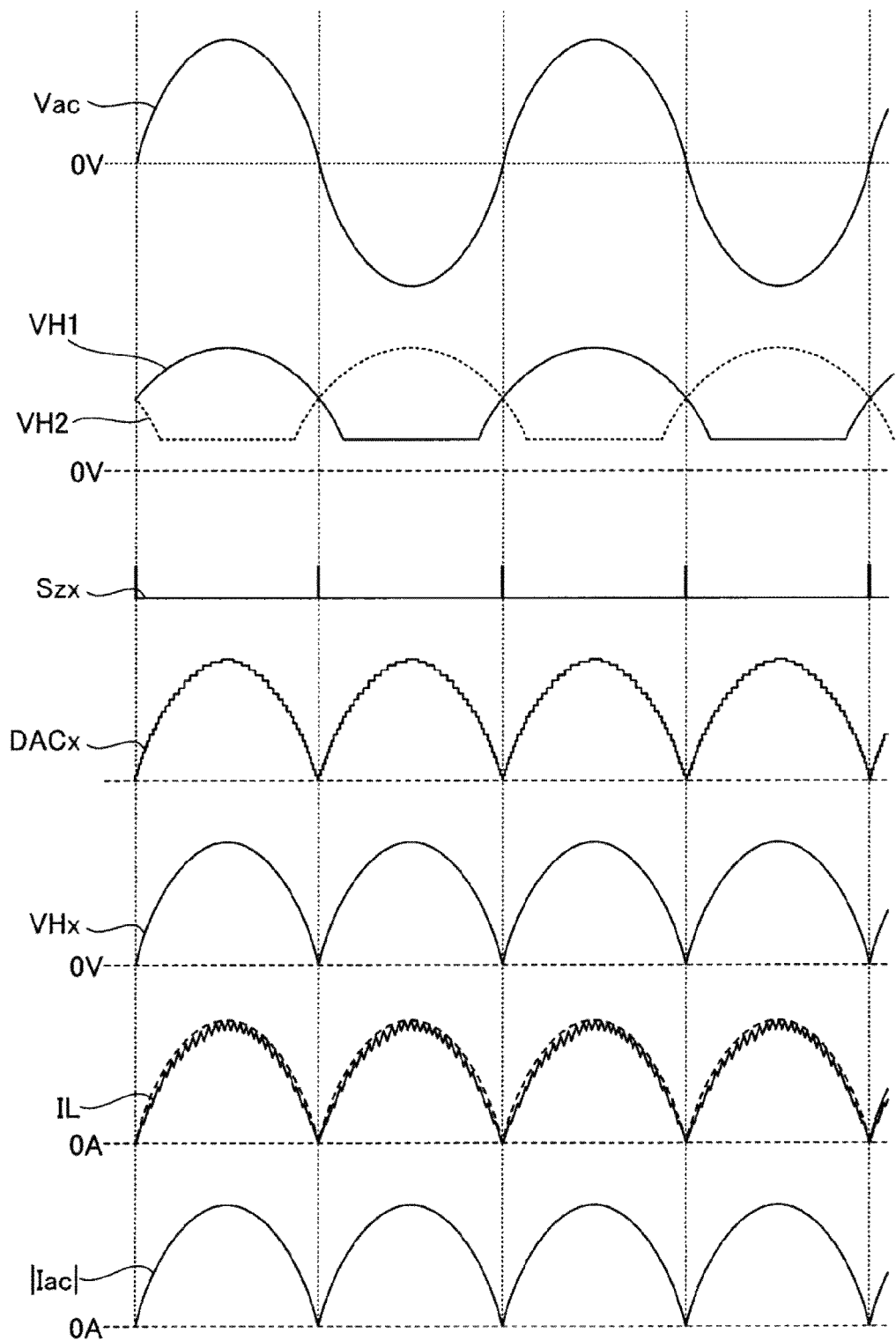
FIG. 10 relates to the embodiment example EX1_2 belonging to the first embodiment of the present disclosure and is a diagram illustrating several voltage waveforms and current waveforms in the power supply device.

Embodiment example EX1_2 will be described. FIG. 9 is a partial configuration diagram of the power supply device 1 according to embodiment example EX1_2. In embodiment example EX1_2, a pulsating generating part 40*b* is used as the pulsating generating part 40, and a PFC control part 100*b* is used as the PFC control part 100. In embodiment example EX1_2, the terminal 105 in FIG. 1 includes two external terminals 105A and 105B. In FIG. 10, several voltage waveforms and current waveforms in the power supply device 1 of embodiment example EX1_2 are illustrated.

The pulsating generating part 40*b* includes diodes 44 and 45 that are rectifier diodes and resistors 46 and 47 for lightning surge protection. The anode of the diode 44 is connected to the interconnect line AL1, and the anode of the diode 45 is connected to the interconnect line BL1. More specifically (see FIG. 3), the anode of the diode 44 is connected to the interconnect line AL1*b*, and the anode of the diode 45 is connected to the interconnect line BL1*b*. However, the anode of the diode 44 may be connected to the interconnect line AL1*a*, and the anode of the diode 45 may be connected to the interconnect line BL1*a*.

The cathode of the diode 44 is connected to the terminal 105A through the resistor 46, whereas the cathode of the diode 45 is connected to the terminal 105B through the resistor 47. Thus, the voltage in the interconnect line AL1 is half-wave rectified by the diode 44 in the pulsating generating part 40*b*, and a voltage VH1 resulting from the half-wave rectification of the voltage in the interconnect line AL1 is applied to the terminal 105A. Meanwhile, the voltage in the interconnect line BL1 is half-wave rectified by the diode 45, and a voltage VH2 resulting from the half-wave rectification of the voltage in the interconnect line BL1 is applied to the terminal 105B. The voltages VH1 and VH2 are pulsating voltages with phases shifted from each other (see FIG. 10).

The PFC control part 100*b* includes voltage divider circuits 210A and 210B, the zero-crossing timing detecting part 220, a cycle detecting part 230, a sine-wave data register 240, a decoder 250, a DAC 260 that is a digital/analog converter (D/A converter), the error amplifier 160, and the switching control part 170.

The voltage divider circuit 210A includes voltage divider resistors 211 and 212 and divides the pulsating voltage VH1 at the terminal 105A to output the divided pulsating voltage VH1 as a pulsating voltage VH1'. More specifically, one end of the voltage divider resistor 211 is connected to the terminal 105A, and the other end of the voltage divider resistor 211 is connected to the ground GND through the voltage divider resistor 212. The pulsating voltage VH1' arises at the connecting node between the voltage divider resistors 211 and 212.

The voltage divider circuit 210B includes voltage divider resistors 213 and 214 and divides the pulsating voltage VH2 at the terminal 105B to output the divided pulsating voltage VH2 as a pulsating voltage VH2'. More specifically, one end of the voltage divider resistor 213 is connected to the terminal 105B, and the other end of the voltage divider resistor 213 is connected to the ground GND through the voltage divider resistor 214. The pulsating voltage VH2' arises at the connecting node between the voltage divider resistors 213 and 214.

The voltage division ratios at the voltage divider circuits 210A and 210B are optional. For example, a voltage division ratio of approximately one to several tens to one to several hundreds is employed. However, it is preferable that the voltage division ratios at the voltage divider circuits 210A and 210B are set identical to each other.

The pulsating voltage VH1 or VH1' is equivalent to a first pulsating voltage, and the pulsating voltage VH2 or VH2' is equivalent to a second pulsating voltage. The potential difference between the first and second pulsating voltages becomes zero at the zero-crossing timing of the alternating-current voltage Vac (i.e., timing when the potential difference between the power supply terminals IN1 and IN2 becomes zero).

The zero-crossing timing detecting part 220 detects (in other words, estimates) the zero-crossing timing of the alternating-current voltage Vac on the basis of the first pulsating voltage and the second pulsating voltage and outputs a zero-crossing detection signal Szx that indicates the detection result. Specifically, the detecting part 220 receives the pulsating voltages VH1' and VH2' and detects, as the zero-crossing timing of the alternating-current voltage Vac, each of a first transition timing at which a transition is made from the state in which the pulsating voltage VH1' is higher than the pulsating voltage VH2' to the state in which the pulsating voltage VH1' is lower than the pulsating voltage VH2' and a second transition timing at which a transition is made from the state in which the pulsating voltage VH1' is lower than the pulsating voltage VH2' to the state in which the pulsating voltage VH1' is higher than the pulsating voltage VH2'. Further, the detecting part 220 generates a pulse that becomes the high level for only a minute time at each of the detected zero-crossing timings in the zero-crossing detection signal Szx. In the signal Szx, the pulses are generated at a cycle half that of the alternating-current voltage Vac. The detecting part 220 can be configured by a comparator that compares the pulsating voltages VH1' and VH2' and a one-shot pulse generating circuit that generates pulses in synchronization with change in an output signal of this comparator.

The cycle detecting part 230 detects the half cycle of the alternating-current voltage Vac by measuring the interval between pulses adjacent to each other in the zero-crossing detection signal Szx (i.e., detects the length of the half cycle of the alternating-current voltage Vac). The half cycle of the alternating-current voltage Vac refers to half of the cycle of the alternating-current voltage Vac. For example, the half cycle of the alternating-current voltage Vac is ¹⁄₁₀₀ seconds when the frequency of the alternating-current voltage Vac is 50 Hz.

Furthermore, a control pulsating voltage generating part including the sine-wave data register 240, the decoder 250, and the DAC 260 generates a control pulsating voltage VHx that has the half cycle of the alternating-current voltage Vac as its own cycle and takes the minimum value (for example, zero) at the zero-crossing timings detected by the detecting part 220 (see FIG. 10). At this time, the control pulsating voltage VHx is generated in such a manner as to have voltage values resulting from full-wave rectification of a sine wave.

Figure 11:
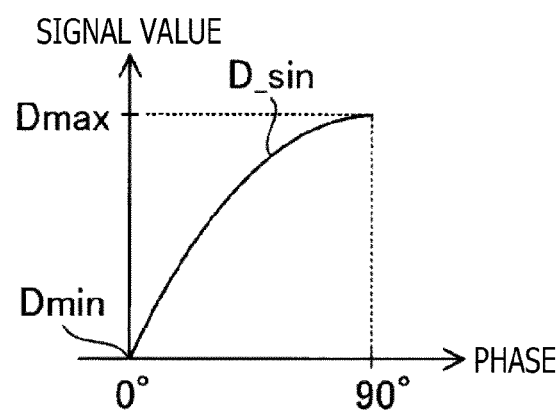
FIG. 11 relates to the embodiment example EX1_2 belonging to the first embodiment of the present disclosure and is a diagram illustrating the waveform of sine-wave data.

The generation method of the control pulsating voltage VHx will be described in detail. The sine-wave data register 240 is a data holding part that holds predetermined sine-wave data. The sine-wave data is data represented through quantizing the signal values of a sine-wave signal. The signal values of the sine-wave signal corresponding to one cycle may be held in the register 240. However, it suffices that sine-wave data D_sin that represents the signal values of the sine-wave signal in a phase range of 0° to 90° like the one illustrated in FIG. 11 is held in the register 240. In FIG. 11, the sine-wave data D_sin is expressed with a smooth curve. However, the sine-wave data D_sin is quantized data and therefore has discrete values according to the phase. The sine-wave data D_sin has signal values from a predetermined minimum value Dmin to a predetermined maximum value Dmax. "0=Dmin<Dmax" holds.

Figure 12:
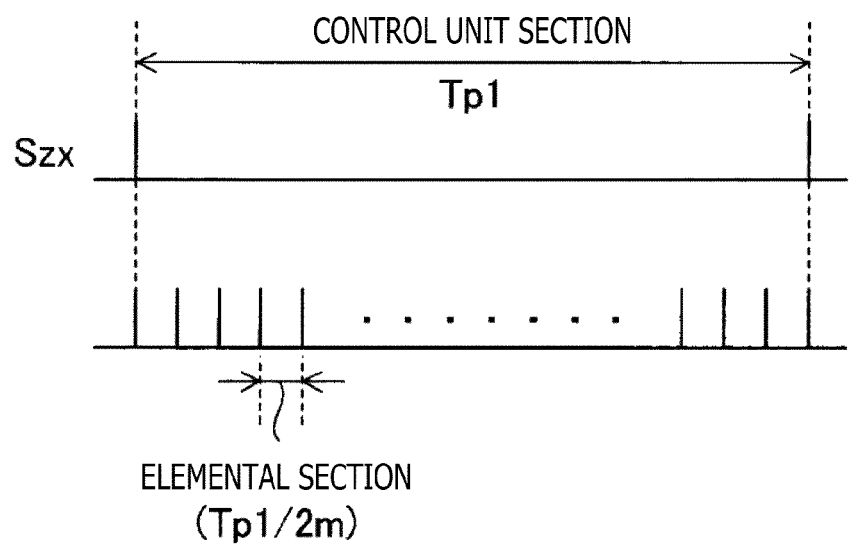
FIG. 12 relates to the embodiment example EX1_2 belonging to the first embodiment of the present disclosure and is a diagram illustrating the state in which a control unit section is divided into plural elemental sections.

Referring to FIG. 12, the interval between pulses adjacent to each other in the zero-crossing detection signal Szx is represented by Tp1. The cycle detecting part 230 sets the section having the length corresponding to the interval Tp1, i.e., the section sandwiched by adjacent two zero-crossing timings in the alternating-current voltage Vac, to a control unit section. The control unit section set in the cycle detecting part 230 is equivalent to the frame described in embodiment example EX1_1 (see FIG. 6). The control unit section comes sequentially and repeatedly at a frequency twice that of the alternating-current voltage Vac. The cycle detecting part 230 equally divides each control unit section into (2×m) sections. Each one section formed by this equal division is referred to as an elemental section. Each control unit section is composed of (2×m) elemental sections in total. The length of the elemental section in a certain control unit section may be decided based on the length of one or more past control unit sections. The decoder 250 extracts necessary digital values from the sine-wave data D_sin held by the register 240, under control by the cycle detecting part 230, and inputs a digital signal DACx having the extracted digital values to the DAC 260. The DAC 260 generates and outputs the control pulsating voltage VHx by converting the input digital signal DACx to an analog voltage signal.

The decoder 250 may extract the necessary digital values from the sine-wave data D_sin under control by the cycle detecting part 230 in such a manner that the digital signal DACx has a digital value that corresponds with or approximates "K×sin((π/2)×(i/m))" in the i-th elemental section of each control unit section (value of the digital signal DACx in the first and m-th elemental sections may be set to zero). K is a predetermined coefficient. This can generate the digital signal DACx having a waveform resulting from full-wave rectification of a sine wave (see FIG. 10). The digital signal DACx has a signal waveform that has the half cycle of the alternating-current voltage Vac as its own cycle and takes the minimum value (for example, zero) at the zero-crossing timings by the detecting part 220. A digital signal generating part that generates the digital signal DACx is formed by the sine-wave data register 240 and the decoder 250.

Because the control pulsating voltage VHx is what is obtained by converting the digital signal DACx to an analog voltage (because the value of the voltage VHx is in proportion to the value of the signal DACx), the control pulsating voltage VHx has a waveform resulting from full-wave rectification of a sine wave. Furthermore, the cycle of the control pulsating voltage VHx corresponds with the half cycle of the alternating-current voltage Vac, and the control pulsating voltage VHx takes the minimum value at the zero-crossing timings by the detecting part 220. The minimum value of the control pulsating voltage VHx is set to zero. However, the minimum value may be allowed to be a value slightly larger than zero. The amplitude of the control pulsating voltage VHx is constant without depending on the amplitude of the alternating-current voltage Vac.

The error amplifier 160 and the switching control part 170 disposed in the PFC control part 100b are the same as the error amplifier 160 and the switching control part 170 disposed in the PFC control part 100a of embodiment example EX1_1, and description of embodiment example EX1_1 is applied to embodiment example EX1_2 regarding operation and configuration of them. However, in the switching control part 170 in the PFC control part 100b, the gate signal Vgate is generated by using the control pulsating voltage VHx from the DAC 260 as the control pulsating voltage. Therefore, in embodiment example EX1_2, the switching control part 170 carries out PWM control to alternately switch on and off the transistor 32 at a predetermined PWM frequency on the basis of the control pulsating voltage VHx and the error voltage Verr. When description of embodiment example EX1_1 is applied to embodiment example EX1_2, symbols "100a" and "VHq" in embodiment example EX1_1 are deemed to be replaced with symbols "100b" and "VHx," respectively, in embodiment example EX1_2.

The same operation and effect as embodiment example EX1_1 can be obtained also by embodiment example EX1_2. Incidentally, particularly in a factory or the like, the voltage in the power supply terminals IN1 and IN2 has already distorted in many cases. However, even in such a case, the zero-crossing timing of the alternating-current voltage Vac corresponds with the intersection timing of the first and second pulsating voltages (VH1 and VH2 or VH1' and VH2'). Thus, in embodiment example EX1_2, the configuration is employed in which the zero-crossing timing of the alternating-current voltage Vac is detected from the intersection timing of the first and second pulsating voltages to reproduce the control pulsating voltage VHx without distortion as the ideal full-wave rectified voltage of the alternating-current voltage Vac and the inductor current IL is controlled by using the control pulsating voltage VHx without distortion. For this reason, it is possible to obtain an excellent harmonic suppression effect even in the situation in which the voltage in the power supply terminals IN1 and IN2 involves distortion.

Embodiment Example EX1_3

Figure 13:
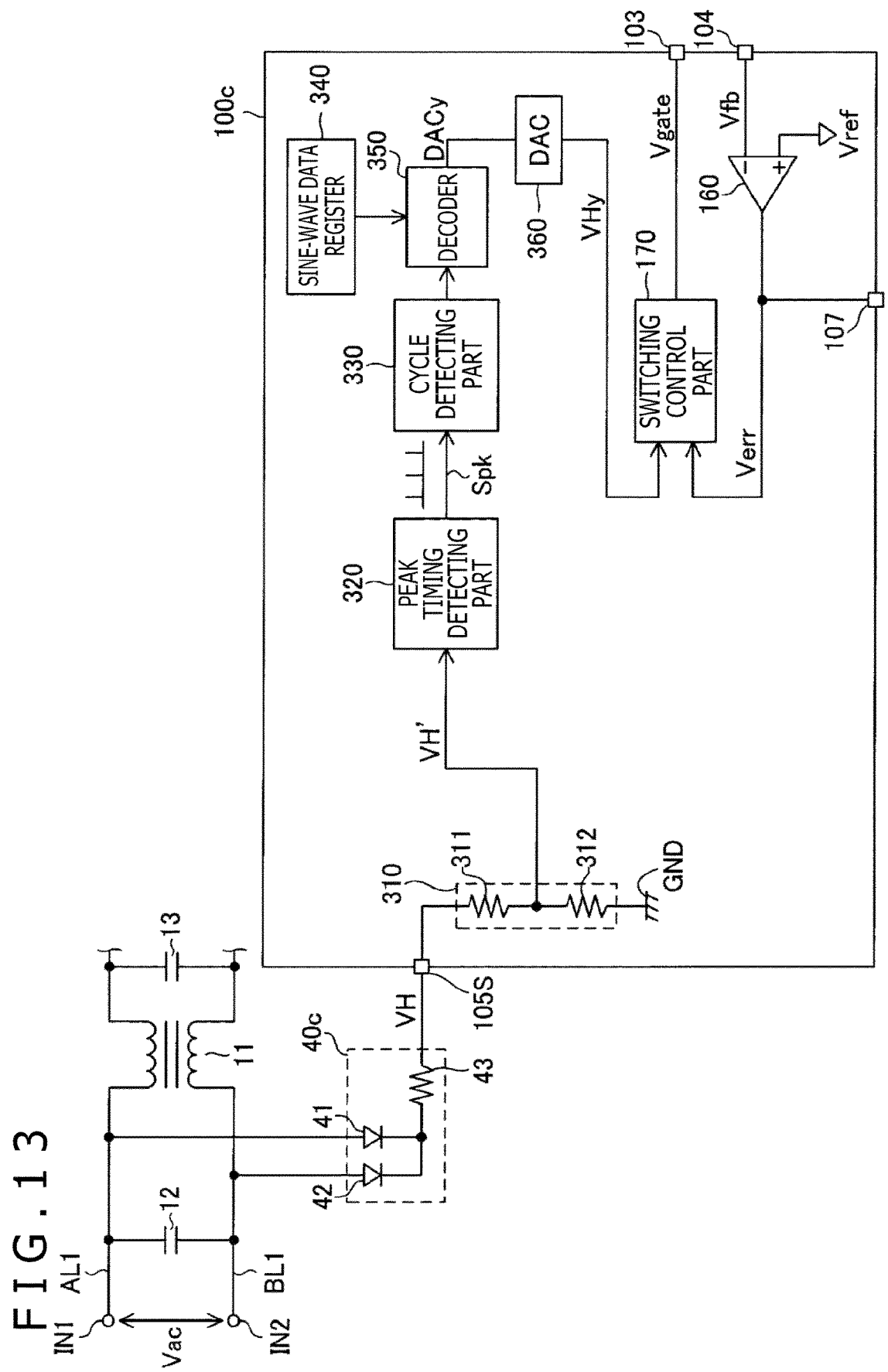
FIG. 13 relates to an embodiment example EX1_3 belonging to the first embodiment of the present disclosure and is a partial configuration diagram of the power supply device.
Figure 14:
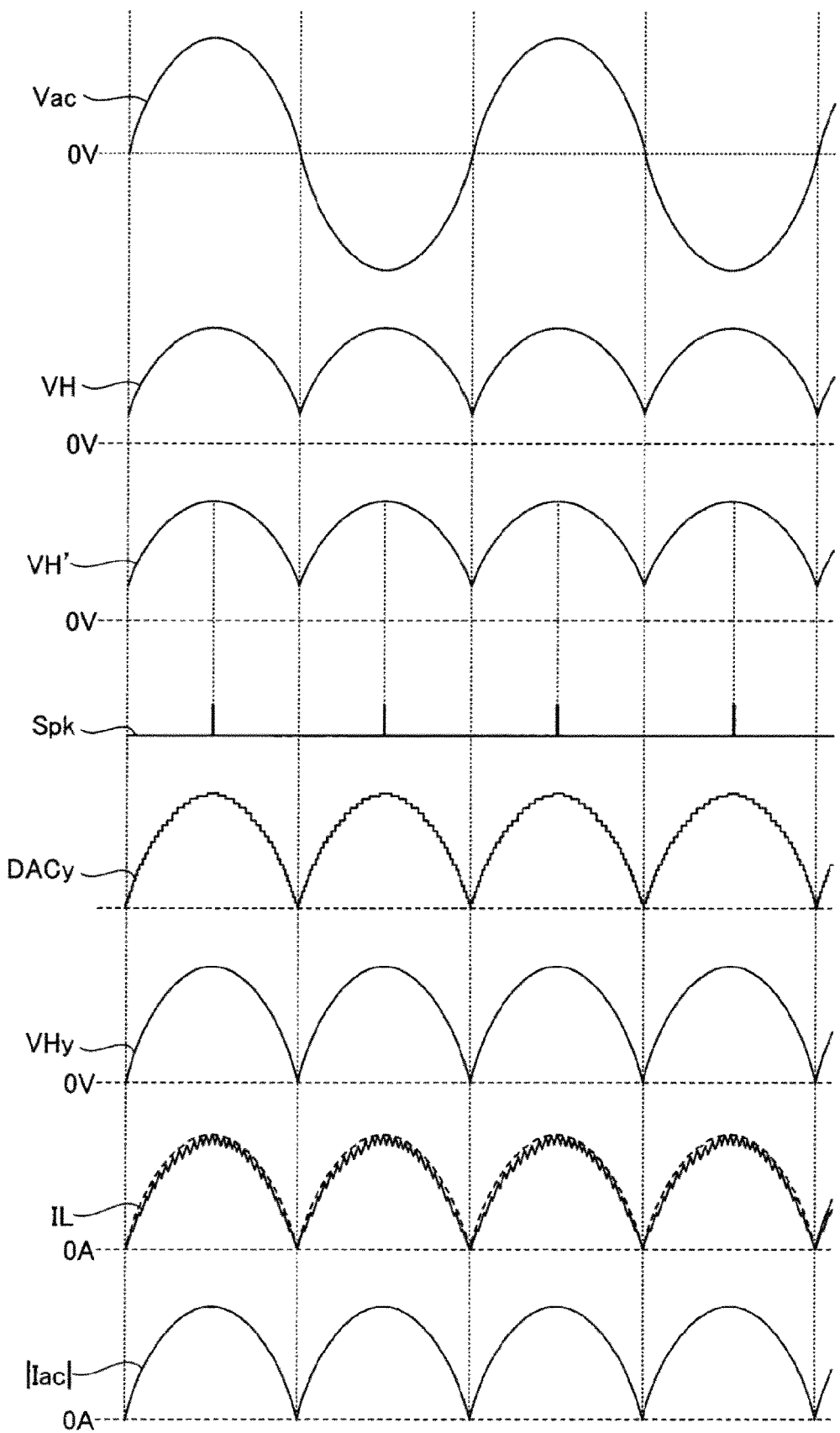
FIG. 14 relates to the embodiment example EX1_3 belonging to the first embodiment of the present disclosure and is a diagram illustrating several voltage waveforms and current waveforms in the power supply device.

Embodiment example EX1_3 will be described. FIG. 13 is a partial configuration diagram of the power supply device 1 according to embodiment example EX1_3. In embodiment example EX1_3, a pulsating generating part 40c is used as the pulsating generating part 40, and a PFC control part 100c is used as the PFC control part 100. In embodiment example EX1_3, the terminal 105 in FIG. 1 includes the single external terminal 105S. In FIG. 14, several voltage waveforms and current waveforms in the power supply device 1 of embodiment example EX1_3 are illustrated.

The pulsating generating part 40c in embodiment example EX1_3 is the same as the pulsating generating part 40a in embodiment example EX1_1 and includes the diodes 41 and 42 that are rectifier diodes and the resistor 43 for lightning surge protection. In embodiment example EX1_3, the connection method among the diodes 41 and 42, the resistor 43, the interconnect lines AL1 and BL1, and the terminal 105S is as described in embodiment example EX1_1. Thus, in the pulsating generating part 40c, the alternating-current voltage Vac between the interconnect lines AL1 and BL1 is full-wave rectified by the diodes 41 and 42, and the full-wave rectified alternating-current voltage Vac is generated as the pulsating voltage VH. The pulsating voltage VH from the pulsating generating part 40c is received at the terminal 105S.

The PFC control part 100c includes a voltage divider circuit 310, a peak timing detecting part 320, a cycle detecting part 330, a sine-wave data register 340, a decoder 350, a DAC 360 that is a digital/analog converter (D/A converter), the error amplifier 160, and the switching control part 170.

The voltage divider circuit 310 has the same configuration and function as the voltage divider circuit 110 (see FIG. 5) in embodiment example EX1_1. Specifically, the voltage divider circuit 310 includes voltage divider resistors 311 and 312 and divides the pulsating voltage VH at the terminal 105S to output the divided pulsating voltage VH as the pulsating voltage VH'. Hereinafter, suppose that the pulsating voltage VH' described in embodiment example EX1_3 is output from the voltage divider circuit 310. More specifically, one end of the voltage divider resistor 311 is connected to the terminal 105S, and the other end of the voltage divider resistor 311 is connected to the ground GND through the voltage divider resistor 312. The pulsating voltage VH' arises at the connecting node between the voltage divider resistors 311 and 312. The voltage division ratio at the voltage divider circuit 310 is optional. For example, a voltage division ratio of approximately one to several tens to one to several hundreds is employed.

The peak timing detecting part 320 detects the peak timings of the pulsating voltage VH' on the basis of the pulsating voltage VH' input from the voltage divider circuit 310 and outputs a peak detection signal Spk that indicates the detection result. The peak timings of the pulsating voltage VH' are the timings when the pulsating voltage VH' takes the maximum value and are equivalent to the timings when the absolute value of the instantaneous value of the alternating-current voltage Vac becomes the maximum (i.e., timings when the magnitude of the potential difference between the power supply terminals IN1 and IN2 takes the maximum value). Specifically, the detecting part 320 detects the timings when the value of the pulsating voltage VH' is shifted from rising to lowering as the peak timings of the pulsating voltage VH' and generates a pulse that becomes the high level for only a minute time at each of the detected peak timings in the peak detection signal Spk. In the signal Spk, the pulses are generated at a cycle half that of the alternating-current voltage Vac (see FIG. 14).

The cycle detecting part 330 detects the half cycle of the alternating-current voltage Vac by measuring the interval between pulses adjacent to each other in the peak detection signal Spk (i.e., detects the length of the half cycle of the alternating-current voltage Vac). The half cycle of the alternating-current voltage Vac refers to half of the cycle of the alternating-current voltage Vac. For example, the half cycle of the alternating-current voltage Vac is $1/100$ seconds when the frequency of the alternating-current voltage Vac is 50 Hz.

Furthermore, a control pulsating voltage generating part including the sine-wave data register 340, the decoder 350, and the DAC 360 generates a control pulsating voltage VHy that has the half cycle of the alternating-current voltage Vac as its own cycle and takes the maximum value at the peak timings detected by the detecting part 320 (see FIG. 14). At this time, the control pulsating voltage VHy is generated in such a manner as to have voltage values resulting from full-wave rectification of a sine wave.

The generation method of the control pulsating voltage VHy will be described in detail. The sine-wave data register 340 is the same as the sine-wave data register 240 in FIG. 9 and is a data holding part that holds predetermined sine-wave data. As described above, the sine-wave data is data represented through quantizing the signal values of a sine-wave signal. The signal values of the sine-wave signal corresponding to one cycle may be held in the register 340. However, it suffices that the sine-wave data D_sin that represents the signal values of the sine-wave signal in a phase range of 0° to 90° like that illustrated in FIG. 11 is held in the register 340.

Figure 15:
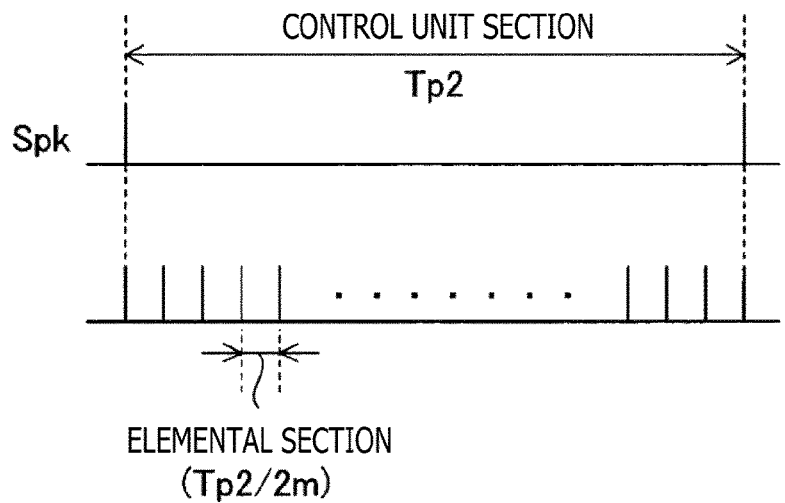
FIG. 15 relates to the embodiment example EX1_3 belonging to the first embodiment of the present disclosure and is a diagram illustrating the state in which a control unit section is divided into plural elemental sections.

Referring to FIG. 15, the interval between pulses adjacent to each other in the peak detection signal Spk is represented by Tp2. The cycle detecting part 330 sets the section having the length corresponding to the interval Tp2, i.e., the section sandwiched by adjacent two peak timings in the alternating-current voltage Vac, to the control unit section. The control unit section comes sequentially and repeatedly at a frequency twice that of the alternating-current voltage Vac. The cycle detecting part 330 equally divides each control unit section into (2×m) sections. Each one section formed by this equal division is referred to as the elemental section. Each control unit section is composed of (2×m) elemental sections in total. The length of the elemental section in a certain control unit section may be decided based on the length of past one or more control unit sections. The decoder 350 extracts necessary digital values from the sine-wave data D_sin held by the register 340, under control by the cycle detecting part 330, and inputs a digital signal DACy having the extracted digital values to the DAC 360. The DAC 360 generates and outputs the control pulsating voltage VHy by converting the input digital signal DACy to an analog voltage signal.

The decoder 350 may extract the necessary digital values from the sine-wave data D_sin under control by the cycle detecting part 330 in such a manner that the digital signal DACy has a digital value that corresponds with or approximates "$K \times \sin(n/2 + (n/2) \times (i/m))$" in the i-th elemental section of each control unit section. K is a predetermined coefficient. This can generate the digital signal DACy having a waveform resulting from full-wave rectification of a sine wave (see FIG. 14). The digital signal DACy has a signal waveform that has the half cycle of the alternating-current voltage Vac as its own cycle and takes the maximum value at the peak timings by the detecting part 320. A digital signal generating part that generates the digital signal DACy is formed by the sine-wave data register 340 and the decoder 350.

Because the control pulsating voltage VHy is what is obtained by converting the digital signal DACy to an analog voltage (because the value of the voltage VHy is in proportion to the value of the signal DACy), the control pulsating voltage VHy has a waveform resulting from full-wave rectification of a sine wave. Furthermore, the cycle of the control pulsating voltage VHy corresponds with the half cycle of the alternating-current voltage Vac, and the control pulsating voltage VHy takes the maximum value at the peak timings by the detecting part 320. The amplitude of the control pulsating voltage VHy is constant without depending on the amplitude of the alternating-current voltage Vac.

The error amplifier 160 and the switching control part 170 disposed in the PFC control part 100c are the same as the error amplifier 160 and the switching control part 170 disposed in the PFC control part 100a of embodiment example EX1_1, and description of embodiment example EX1_1 is applied to embodiment example EX1_3 regarding operation and configuration of them. However, in the switching control part 170 in the PFC control part 100c, the gate signal Vgate is generated by using the control pulsating voltage VHy from the DAC 360 as the control pulsating voltage. Therefore, in embodiment example EX1_3, the switching control part 170 carries out PWM control to alternately switch on and off the transistor 32 at a predetermined PWM frequency on the basis of the control pulsating voltage VHy and the error voltage Verr. When description of embodiment example EX1_1 is applied to embodiment example EX1_3, symbols "100a" and "VHq" in embodiment example EX1_1 are deemed to be replaced with symbols "100c" and "VHy," respectively, in embodiment example EX1_3.

The same operation and effect as embodiment example EX1_1 can be obtained also by embodiment example EX1_3.

The peak timing detecting part 320 intends to detect the timings when the absolute value of the instantaneous value of the alternating-current voltage Vac becomes the maximum. That is, the peak timings of the pulsating voltage VH' detected in the detecting part 320 are equivalent to what are obtained by estimating the timings when the absolute value of the instantaneous value of the alternating-current voltage Vac becomes the maximum. The power factor correction is optimized if this estimation is accurate. However, the peak timings of the pulsating voltage VH' are susceptible to the influence of distortion of the voltage in the power supply terminals IN1 and IN2, and possibly, an error is included in the above-described estimation. In view of this point, the configuration of embodiment example EX1_2 is more preferable than the configuration of embodiment example EX1_3.

Second Embodiment

A second embodiment of the present disclosure will be described. The second embodiment is an embodiment based on the first embodiment. Regarding matters that are not particularly described in the second embodiment, description of the first embodiment is applied also to the second embodiment as long as contradiction does not exist. In interpretation of description of the second embodiment, priority may be given to the description of the second embodiment regarding a matter that contradicts between the first and second embodiments.

Figure 16:
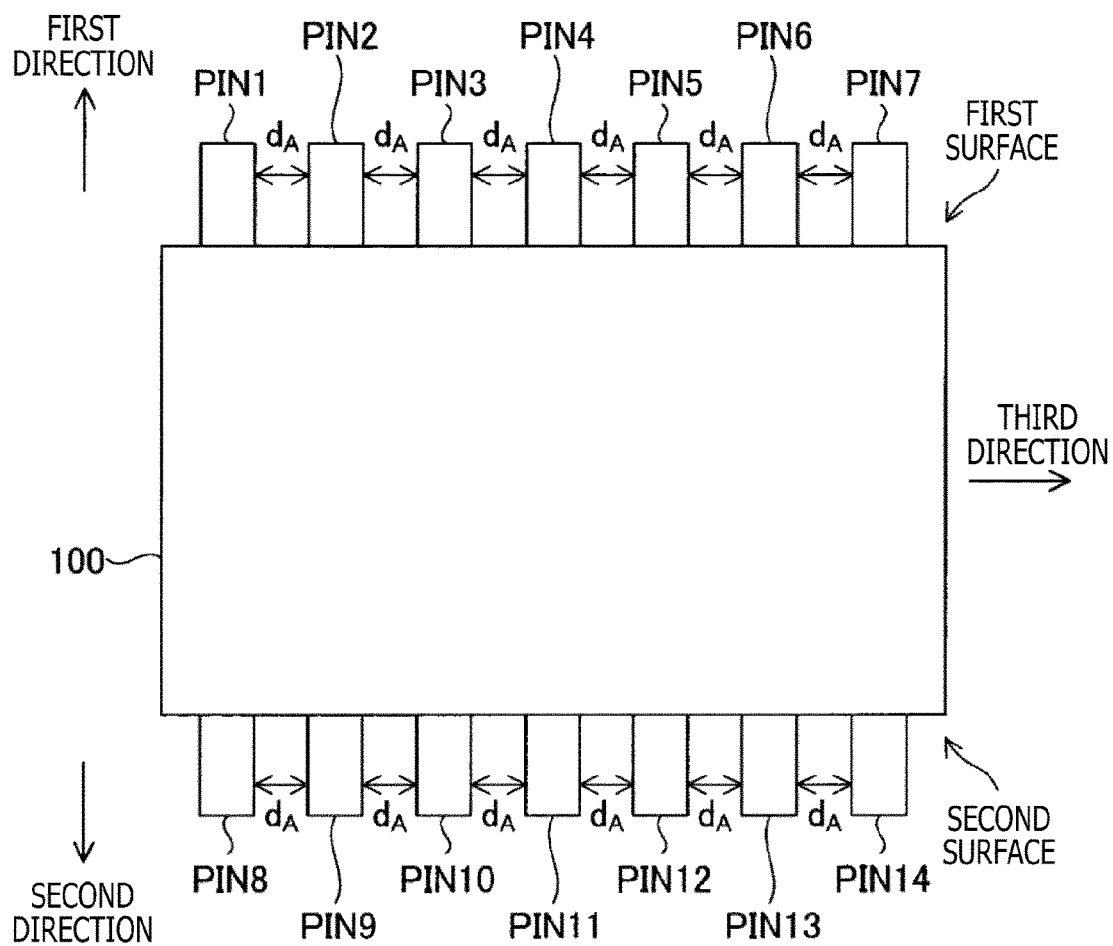
FIG. 16 relates to a second embodiment of the present disclosure and is a diagram illustrating the basic arrangement structure of external terminals in the PFC control part.

In FIG. 16, the basic arrangement structure of external terminals in the PFC control part 100 is illustrated. One or more semiconductor substrates that configure the PFC control part 100 are enclosed in a casing (package) formed with a resin. A semiconductor integrated circuit is formed on each semiconductor substrate.

The casing of the PFC control part 100 has a substantially rectangular parallelepiped shape. In the PFC control part 100 relating to the basic arrangement structure, external terminals PIN1 to PIN7 are disposed to protrude from a first surface of this casing in a first direction, and external terminals PIN8 to PIN14 are disposed to protrude from a second surface of this casing in a second direction. All external terminals PIN1 to PIN14 are exposed from the casing of the PFC control part 100. The first surface and the second surface are surfaces opposed to each other, and the second direction is a direction opposite to the first direction. A third direction is a direction that is parallel to the first surface and the second surface and is orthogonal to the first direction and the second direction. On the first surface in the basic arrangement structure, the external terminals PIN1, PIN2, PIN3, PIN4, PIN5, PIN6, and PIN7 are arranged in that order along the third direction. Furthermore, on the second surface in the basic arrangement structure, the external terminals PIN8, PIN9, PIN10, PIN11, PIN12, PIN13, and PIN14 are arranged in that order along the third direction. The external terminal PIN1 is disposed at an end part of the first surface, and the external terminal PIN7 is disposed at the other end part of the first surface. The external terminal PIN8 is disposed at an end part of the second surface, and the external terminal PIN14 is disposed at the other end part of the second surface.

In the basic arrangement structure, the external terminals PIN1 to PIN7 are disposed at equal intervals on the first surface, and the external terminals PIN8 to PIN14 are disposed at equal intervals on the second surface. In the basic arrangement structure, the interval between two external terminals adjacent to each other is constant and has a distance $d_A$.

Although it is assumed that the number of external terminals of the PFC control part 100 is 14 here (although it is assumed that the number is 12 in embodiment example EX2_1 to be described later: see FIG. 18), the number of external terminals of the PFC control part 100 can be changed optionally.

Figure 17:
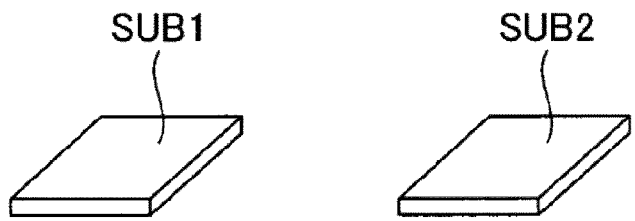
FIG. 17 relates to the second embodiment of the present disclosure and is a diagram illustrating two semiconductor substrates that configure the PFC control part.

In the second embodiment, particularly, attention is focused on the PFC control part 100b (see FIG. 9) according to embodiment example EX1_2 as the PFC control part 100. Furthermore, here, suppose that the PFC control part 100b is configured by two semiconductor substrates SUB1 and SUB2 (see FIG. 17) separated from each other. However, the PFC control part 100b may be configured by using only one semiconductor substrate or three or more semiconductor substrates.

The voltage divider circuits 210A and 210B are integrated on the semiconductor substrate SUB1. It is preferable to form the voltage divider circuits 210A and 210B by using poly-silicon resistors having a high breakdown voltage (for example, using poly-silicon resistors having a breakdown voltage equal to or higher than 400 V). On the semiconductor substrate SUB2, the circuits other than the voltage divider circuits 210A and 210B (including zero-crossing timing detecting part 220, cycle detecting part 230, sine-wave data register 240, decoder 250, DAC 260, error amplifier 160, and switching control part 170 illustrated in FIG. 9) in the circuits that configure the PFC control part 100*b* are integrated. The semiconductor substrates SUB1 and SUB2 are connected by using wire bonding. That is, for example, the pulsating voltages VH1′ and VH2′ generated in the voltage divider circuits 210A and 210B on the semiconductor substrate SUB1 are transmitted to the zero-crossing timing detecting part 220 on the semiconductor substrate SUB2 by using the wire bonding.

The second embodiment includes the following embodiment examples EX2_1 to EX2_3. With embodiment examples EX2_1 to EX2_3, specific examples relating to the arrangement of the external terminals will be described. Matters described above in the present embodiment are applied to the following embodiment examples EX2_1 to EX2_3 as long as a particular description is not made and contradiction does not exist, and, in each embodiment example, priority may be given to description in the embodiment example regarding a matter that contradicts the above-described matter. Furthermore, it is also possible to apply a matter described in any embodiment example in embodiment examples EX2_1 to EX2_3 to any other optional embodiment example as long as contradiction does not exist (that is, it is also possible to combine any two or more embodiment examples in the plural embodiment examples).

Embodiment Example EX2_1

Embodiment example EX2_1 will be described. In embodiment example EX2_1 and embodiment examples EX2_2 and EX2_3 to be described later, arrangement configurations of the external terminals of the PFC control part 100*b* in embodiment example EX1_2 corresponding to FIG. 9 will be described. FIG. 18 illustrates an arrangement configuration of the external terminals of the PFC control part 100*b* according to embodiment example EX2_1.

In embodiment example EX2_1, the external terminals PIN2 and PIN4 are removed on the basis of the basic arrangement configuration of FIG. 16. In addition, the external terminal PIN1 is used as terminal 105A in FIG. 9, and the external terminal PIN3 is used as the terminal 105B in FIG. 9. The external terminals PIN1 and PIN3 function as first and second external terminals, respectively. As is understood from the above description, the terminal 105A is the first external terminal that receives the half-wave rectified voltage (VH1) of the voltage applied to the power supply terminal IN1, and the terminal 105B is the second external terminal that receives the half-wave rectified voltage (VH2) of the voltage applied to the power supply terminal IN2.

In embodiment example EX2_1, in association with the removal of the external terminal PIN2, the external terminal PIN1 (first external terminal) and the external terminal PIN3 (second external terminal) become two external terminals adjacent to each other, and the distance between the external terminals PIN1 and PIN3 becomes a distance $d_B$. The distance $d_B$ is longer than the above-described distance $d_A$. As is apparent from the above description, the distance $d_A$ is the distance between any two external terminals adjacent to each other (for example, distance between the external terminals PIN5 and PIN6) in the external terminals PIN5 to PIN14 (plural third external terminals).

Furthermore, because the external terminal PIN4 is removed, the external terminal (third external terminal) adjacent to the external terminal PIN3 (terminal 105B) in the external terminals PIN5 to PIN14 (plural third external terminals) is the external terminal PIN5, and the distance between the external terminals PIN3 and PIN5 is also the distance $d_B$ and is longer than the distance $d_A$.

In embodiment example EX2_1, functions of the terminals 101 to 104, 106, and 107 in FIG. 1 or other functions are assigned to the external terminals PIN5 to PIN14. For example, the external terminals PIN5 and PIN6 may be used as the terminals 106 and 102, respectively. One or more external terminals in the external terminals PIN5 to PIN14 may be an external terminal connected to none of the semiconductor substrates that configure the PFC control part 100 (here 100*b*) (hereinafter, referred to as an NC terminal). An external terminal that is not illustrated in FIG. 1 may exist, and a function of an external terminal that is not illustrated in FIG. 1 may be assigned to any of the external terminals PIN5 to PIN14.

A high voltage is applied to the external terminals PIN1 and PIN3 used as the terminals 105A and 105B compared with the other external terminals. According to the arrangement structure of embodiment example EX2_1, it becomes easier to ensure the necessary creepage distance relating to insulation.

Figure 18:
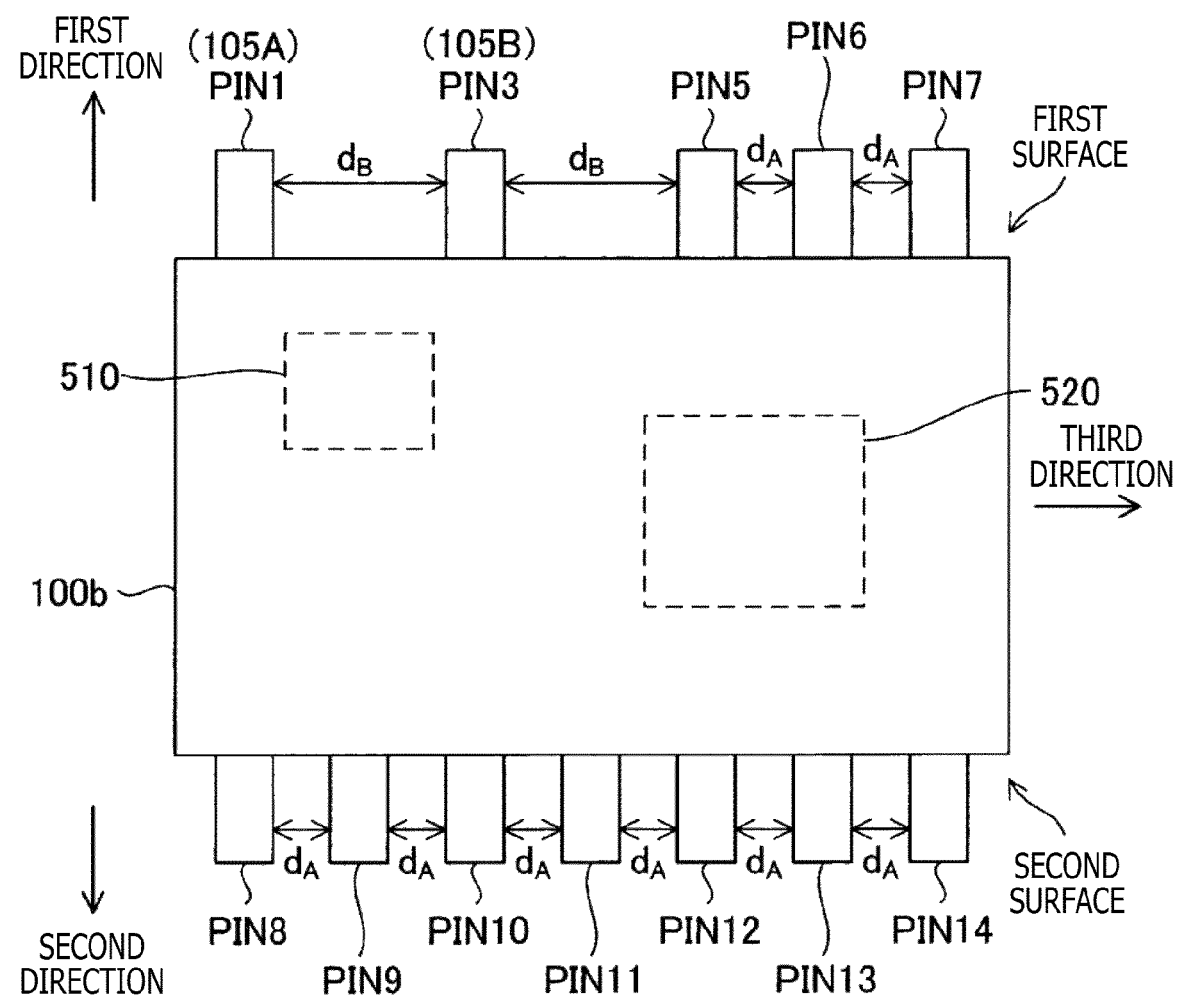
FIG. 18 relates to an embodiment example EX2_1 belonging to the second embodiment of the present disclosure and is a diagram illustrating the arrangement of the external terminals in the PFC control part.

Further, regions 510 and 520 surrounded by two dashed-line frames are illustrated in FIG. 18. The regions 510 and 520 are two regions separated from each other in the casing of the PFC control part 100*b*. The semiconductor substrate SUB1 is disposed in the region 510, and the semiconductor substrate SUB2 is disposed in the region 520. The external terminals PIN1 and PIN3 are connected to the semiconductor substrate SUB1 by using wire bonding. Some or all of the external terminals PIN5 to PIN14 are connected to the semiconductor substrate SUB2 by using wire bonding.

Here, it is preferable that the semiconductor substrate SUB1 disposed in the region 510 is disposed closer to the external terminal PIN1 (first external terminal) than to the external terminal PIN5 (third external terminal) adjacent to the external terminal PIN3 (second external terminal). In other words, it is preferable that the shortest distance between the semiconductor substrate SUB1 and the external terminal PIN1 is shorter than the shortest distance between the semiconductor substrate SUB1 and the external terminal PIN5. Further, it is preferable that the region 510 (therefore, semiconductor substrate SUB1) is closer to the first surface than to the second surface.

Moreover, it is preferable that the semiconductor substrate SUB2 disposed in the region 520 is disposed closer to the external terminal PIN5 (third external terminal) than to the external terminal PIN1 (first external terminal). In other words, it is preferable that the shortest distance between the semiconductor substrate SUB2 and the external terminal PIN5 is shorter than the shortest distance between the semiconductor substrate SUB2 and the external terminal PIN1.

Based on these features, implementing appropriate routing of wires in the wire bonding and so forth are intended.

Embodiment Example EX2_2

Figure 19:
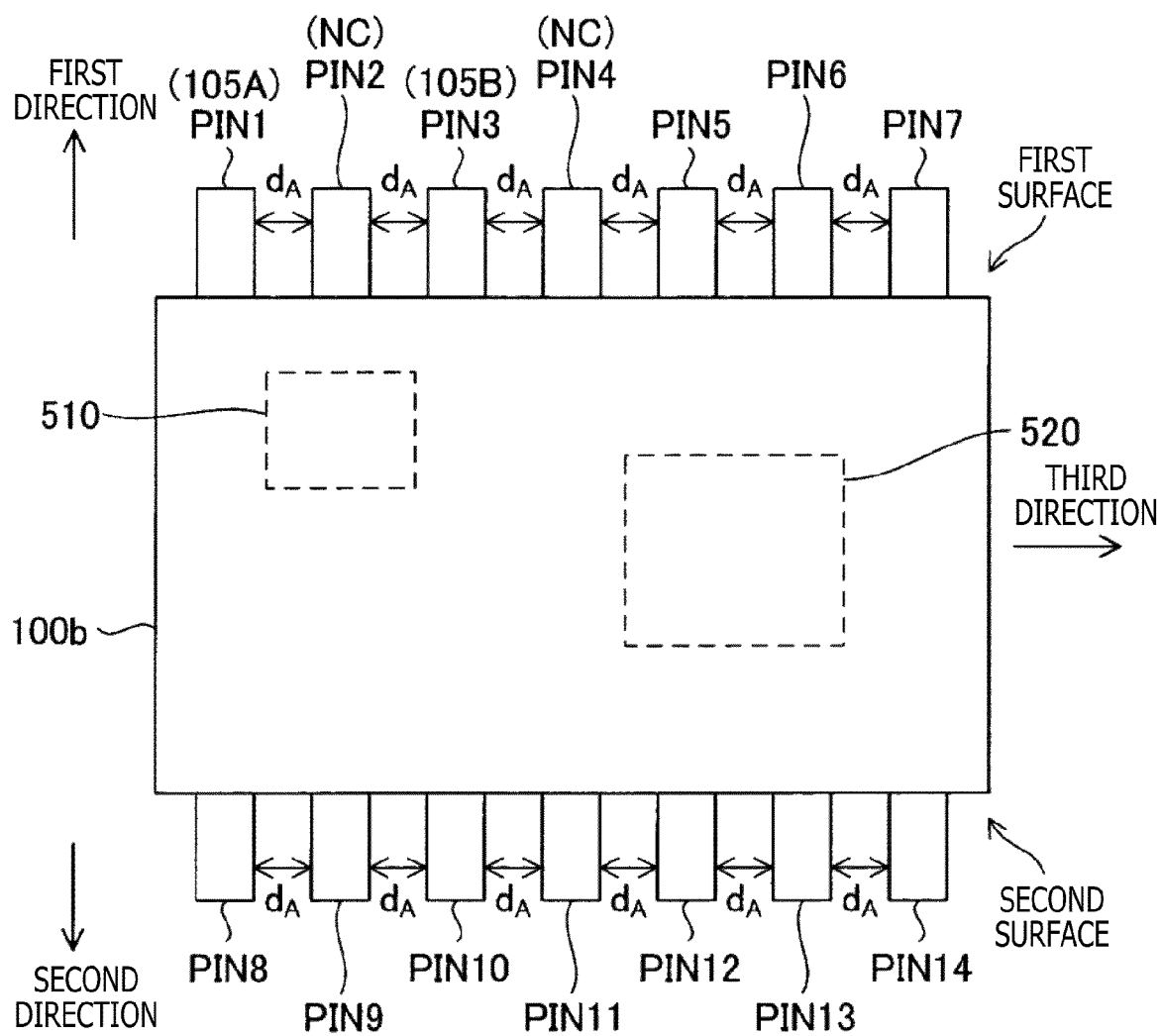
FIG. 19 relates to an embodiment example EX2_2 belonging to the second embodiment of the present disclosure and is a diagram illustrating the arrangement of the external terminals in the PFC control part.
Figure 20:
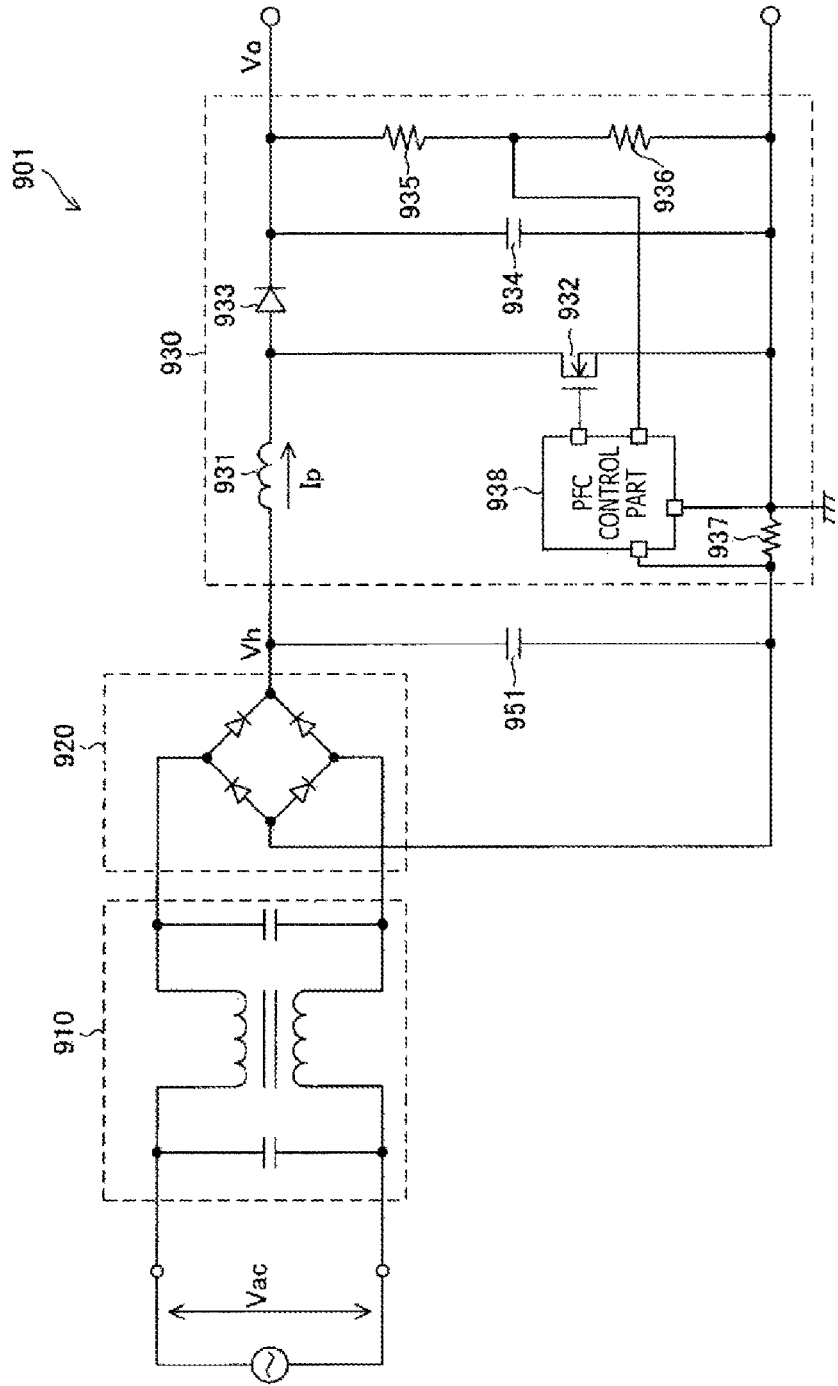
FIG. 20 relates to a reference configuration and is an overall configuration diagram of a power supply device having a power factor correction function.
Figure 21:
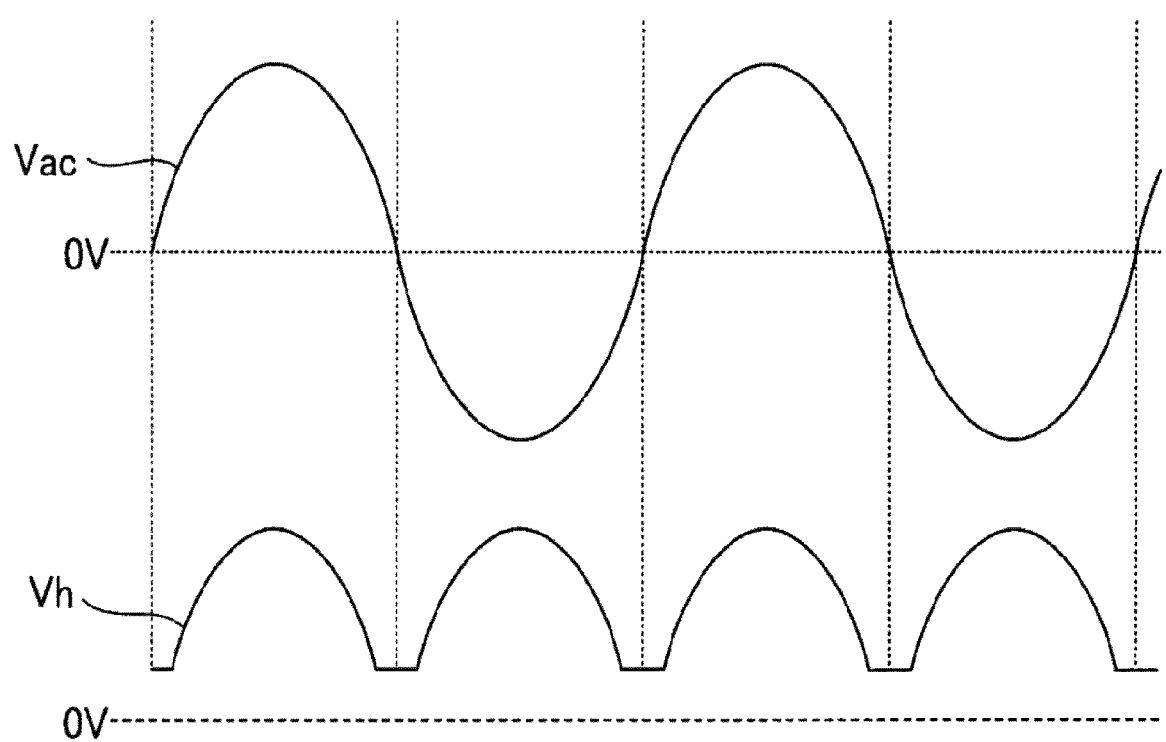
FIG. 21 is a waveform diagram of an alternating-current voltage and a full-wave rectified voltage relating to the power supply device of FIG. 20.

Embodiment example EX2_2 will be described. FIG. 19 illustrates an arrangement configuration of the external terminals of the PFC control part 100*b* according to embodiment example EX2_2.

In embodiment example EX2_2, the basic arrangement structure of FIG. 16 is employed as it is. In addition, the external terminal PIN1 is used as terminal 105A in FIG. 9, and the external terminal PIN3 is used as the terminal 105B in FIG. 9. The external terminals PIN1 and PIN3 function as the first and second external terminals, respectively. Moreover, each of the external terminals PIN2 and PIN4 is set as the NC terminal. That is, in embodiment example EX2_2, the external terminals PIN2 and PIN4 are connected to none of the semiconductor substrates that form the PFC control part 100b (connected to neither the semiconductor substrate SUB1 nor the semiconductor substrate SUB2).

In embodiment example EX2_2, functions of the terminals 101 to 104, 106, and 107 in FIG. 1 or other functions are assigned to the external terminals PIN5 to PIN14. For example, the external terminals PIN5 and PIN6 may be used as the terminals 106 and 102, respectively. One or more external terminals in the external terminals PIN5 to PIN14 may be the NC terminal. An external terminal that is not illustrated in FIG. 1 may exist, and a function of an external terminal that is not illustrated in FIG. 1 may be assigned to any of the external terminals PIN5 to PIN14.

A high voltage is applied to the external terminals PIN1 and PIN3 used as the terminals 105A and 105B compared with the other external terminals. Also according to the arrangement structure of embodiment example EX2_2, it becomes easier to ensure the necessary creepage distance relating to insulation.

In the example of FIG. 19, only one NC terminal (fourth external terminal) exists between the external terminal PIN1 (first external terminal) and the external terminal PIN3 (second external terminal). However, two or more NC terminals (fourth external terminals) may be disposed between the external terminals PIN1 and PIN3.

Further, the external terminals connected to the semiconductor substrate SUB2 in the external terminals PIN5 to PIN14 are referred to as the third external terminals. Plural third external terminals are present. The external terminal PIN5 may belong to the third external terminals. In this case, the external terminal PIN5 is the third external terminal closest to the external terminal PIN3 (second external terminal) in the plural third external terminals. In the example of FIG. 19, only one NC terminal (fourth external terminal) exists between the external terminal PIN5 (third external terminal) and the external terminal PIN3 (second external terminal). However, two or more NC terminals (fourth external terminals) may be disposed between the external terminals PIN5 and PIN3.

The regions 510 and 520 surrounded by two dashed-line frames are illustrated in FIG. 19. The regions 510 and 520 are two regions separated from each other in the casing of the PFC control part 100b. The semiconductor substrate SUB1 is disposed in the region 510, and the semiconductor substrate SUB2 is disposed in the region 520. The external terminals PIN1 and PIN3 are connected to the semiconductor substrate SUB1 by using wire bonding. Some or all of the external terminals PIN5 to PIN14 are connected to the semiconductor substrate SUB2 by using wire bonding. As described above, the NC terminals including the external terminals PIN2 and PIN4 are connected to neither the semiconductor substrate SUB1 nor the semiconductor substrate SUB2.

It is preferable that the semiconductor substrate SUB1 disposed in the region 510 is disposed closer to the external terminal PIN1 (first external terminal) than to the third external terminal (PIN5) closest to the external terminal PIN3 (second external terminal) in the plural third external terminals. In other words, it is preferable that the shortest distance between the semiconductor substrate SUB1 and the external terminal PIN1 is shorter than the shortest distance between the semiconductor substrate SUB1 and the external terminal PIN5. Further, it is preferable that the region 510 (therefore, semiconductor substrate SUB1) is closer to the first surface than to the second surface.

Moreover, it is preferable that the semiconductor substrate SUB2 disposed in the region 520 is disposed closer to the external terminal PIN5 (third external terminal) than to the external terminal PIN1 (first external terminal). In other words, it is preferable that the shortest distance between the semiconductor substrate SUB2 and the external terminal PIN5 is shorter than the shortest distance between the semiconductor substrate SUB2 and the external terminal PIN1.

Based on these features, implementing appropriate routing of wires in the wire bonding and so forth are intended.

Embodiment Example EX2_3

Embodiment example EX2_3 will be described. The arrangement method of the external terminals can be variously modified.

For example, the external terminals PIN2 and PIN9 may be removed on the basis of the basic arrangement structure of FIG. 16, the external terminal PIN1 may be used as the terminal 105A in FIG. 9, and the external terminal PIN8 may be used as the terminal 105B in FIG. 9. In this case, the external terminals PIN1 and PIN8 are connected to the semiconductor substrate SUB1 disposed near an intermediate position between the external terminals PIN1 and PIN8 by using wire bonding, and some or all of the external terminals PIN3 to PIN7 and PIN10 to PIN14 are connected to the semiconductor substrate SUB2 disposed near an intermediate position between the external terminals PIN3 to PIN7 and PIN10 to PIN14 by using wire bonding.

Alternatively, for example, with the basic arrangement structure itself of FIG. 16 employed, the external terminal PIN1 may be used as the terminal 105A in FIG. 9, and the external terminal PIN8 may be used as the terminal 105B in FIG. 9. In addition, the external terminals PIN2 and PIN9 may be set as the NC terminals. Also in this case, the external terminals PIN1 and PIN8 are connected to the semiconductor substrate SUB1 disposed near an intermediate position between the external terminals PIN1 and PIN8 by using wire bonding, and some or all of the external terminals PIN3 to PIN7 and PIN10 to PIN14 are connected to the semiconductor substrate SUB2 disposed near an intermediate position between the external terminals PIN3 to PIN7 and PIN10 to PIN14 by using wire bonding.

<<Modifications and so Forth>>

Several modified techniques regarding the first and second embodiments will be described.

In the configuration of FIG. 5, the voltage divider circuit 110 may be disposed outside the PFC control part 100a and be externally connected to the PFC control part 100a. In this case, the pulsating voltage VH' may be supplied to the terminal 105S instead of the pulsating voltage VH.

In the configuration of FIG. 9, the voltage divider circuits 210A and 210B may be disposed outside the PFC control part 100b and be externally connected to the PFC control part 100b. In this case, the pulsating voltage VH1' may be supplied to the terminal 105A instead of the pulsating voltage VH1, and the pulsating voltage VH2' may be supplied to the terminal 105B instead of the pulsating voltage VH2.

In the configuration of FIG. 13, the voltage divider circuit 310 may be disposed outside the PFC control part 100c and be externally connected to the PFC control part 100c. In this case, the pulsating voltage VH' may be supplied to the terminal 105S instead of the pulsating voltage VH.

Regarding any signal or voltage, the relation between the high level and the low level of them may be reversed in a form that does not impair the above-described gist.

A DC/DC converter (not illustrated) that converts the direct-current output voltage Vout to another direct-current voltage may be disposed at the subsequent stage of the power supply device 1. The output voltage Vout or the other direct-current voltage is provided to any load device (not illustrated).

Any electrical equipment including the power supply device 1, a DC/DC converter that converts the direct-current output voltage Vout to another direct-current voltage, and a load device driven by using the other direct-current voltage may be configured (not illustrated except for the power supply device 1). The electrical equipment may be a home electrical appliance such as illuminating equipment or television receiver or may be industrial equipment.

It is also possible to form the transistor 32 as a switching element by a junction FET, insulated gate bipolar transistor (IGBT), or bipolar transistor.

Embodiments of the present disclosure can be variously changed as appropriate within the range of technical ideas illustrated in the scope of claims. The above embodiments are absolutely examples of embodiments of the present disclosure, and the meanings of terms of the present disclosure or the respective constituent elements are not limited to what are described in the above embodiments. Specific numerical values illustrated in the above explanatory text are merely exemplification, and naturally, they can be changed to various numerical values.

What is claimed is:

1. A control device of a power factor correction circuit disposed in a power supply device that generates a direct-current output voltage from an alternating- current voltage applied to a power supply terminal pair, the control device comprising: a minimum value detecting part that detects a minimum value of a pulsating voltage; an error amplifier that generates an error voltage based on a feedback voltage and a predetermined reference voltage, wherein the feedback voltage is generated by dividing the direct-current output voltage; a pulsating voltage correcting part that generates a corrected pulsating voltage by shifting the pulsating voltage to a negative side such that the detected minimum value of the pulsating voltage becomes equal to zero voltage, wherein the pulsating voltage is shifted to the negative side based on the detected minimum value; and a switching control part that controls a state of a switching element based on the feedback voltage and the corrected pulsating voltage, wherein the power factor correction circuit comprises: an inductor that is disposed between a full-wave rectification circuit that generates a full-wave rectified voltage by carrying out full-wave rectification of the alternating-current voltage and an output interconnect line to which a smoothing capacitor is connected and to which the direct- current output voltage is applied, and is inserted between the full-wave rectification circuit and the output interconnect line; and the switching element for controlling an inductor current that flows in the inductor, and the pulsating voltage is obtained by rectifying a first voltage between the power supply terminal pair and the full-wave rectification circuit.

2. The control device of the power factor correction circuit according to claim 1, wherein
the inductor current flows through the switching element in an on-section of the switching element, and
a freewheeling element for leading the inductor current in an off-section of the switching element to the output interconnect line is disposed in the power factor correction circuit.

3. The control device of the power factor correction circuit according to claim 1, wherein the alternating-current voltage between the power supply terminal pair and the full-wave rectification circuit is subjected to full-wave rectification separately from the full-wave rectification circuit, and the pulsating voltage is generated through voltage division of a result of the full-wave rectification.

4. The control device of the power factor correction circuit according to claim 3, wherein
the control device comprises
an amplitude detecting part that detects an amplitude of the pulsating voltage, and
a control pulsating voltage generating part that generates a control pulsating voltage by correcting an amplitude of the corrected pulsating voltage on a basis of the amplitude detected by the amplitude detecting part.

5. The control device of the power factor correction circuit according to claim 4, wherein the switching control part carries out pulse width modulation control to alternately switch on and off the switching element at a predetermined pulse width modulation frequency and controls an on-duty of the switching element on a basis of the control pulsating voltage and the error voltage in the pulse width modulation control.

6. The control device of the power factor correction circuit according to claim 1, wherein
a common mode filter is disposed between the power supply terminal pair and the full-wave rectification circuit, and
the pulsating voltage is extracted from interconnect lines between the power supply terminal pair and the common mode filter.

7. A power factor correction circuit disposed in a power supply device that generates a direct-current output voltage from an alternating-current voltage applied to a power supply terminal pair, the power factor correction circuit comprising:
an inductor that is disposed between a full-wave rectification circuit that generates a full-wave rectified voltage by carrying out full-wave rectification of the alternating-current voltage and an output interconnect line to which a smoothing capacitor is connected and to which the direct-current output voltage is applied, and is inserted between the full-wave rectification circuit and the output interconnect line;
a switching element for controlling an inductor current that flows in the inductor; and
the control device according to claim 1.

8. A power supply device that generates a direct-current output voltage from an alternating-current voltage applied to a power supply terminal pair, the power supply device comprising:
a full-wave rectification circuit that generates a full-wave rectified voltage by carrying out full-wave rectification of the alternating-current voltage;
an output interconnect line to which a smoothing capacitor is connected and to which the direct-current output voltage is applied; and
the power factor correction circuit according to claim 7 disposed between the full-wave rectification circuit and the output interconnect line.

* * * * *